United States Patent
Makino et al.

(10) Patent No.: US 10,913,248 B2
(45) Date of Patent: Feb. 9, 2021

(54) METHOD FOR MANUFACTURING ELECTRONIC COMPONENT, RESIN COMPOSITION FOR TEMPORARY FIXING, RESIN FILM FOR TEMPORARY FIXING, AND RESIN FILM SHEET FOR TEMPORARY FIXING

(71) Applicant: Hitachi Chemical Company, Ltd., Tokyo (JP)

(72) Inventors: Tatsuya Makino, Tokyo (JP); Shogo Sobue, Tokyo (JP); Takahiro Tokuyasu, Tokyo (JP); Manabu Ishii, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 273 days.

(21) Appl. No.: 15/778,775

(22) PCT Filed: Nov. 24, 2016

(86) PCT No.: PCT/JP2016/084800
§ 371 (c)(1),
(2) Date: May 24, 2018

(87) PCT Pub. No.: WO2017/090681
PCT Pub. Date: Jun. 1, 2017

(65) Prior Publication Data
US 2018/0339497 A1  Nov. 29, 2018

(30) Foreign Application Priority Data

Nov. 26, 2015  (JP) .................................. 2015-230594
Nov. 26, 2015  (JP) .................................. 2015-230597

(51) Int. Cl.
*B32B 27/08* (2006.01)
*H01L 21/02* (2006.01)
(Continued)

(52) U.S. Cl.
CPC ............ *B32B 27/08* (2013.01); *B32B 27/308* (2013.01); *C08K 5/3445* (2013.01); *C08L 33/10* (2013.01);
(Continued)

(58) Field of Classification Search
CPC . B32B 27/08; B32B 27/308; H01L 21/02057; H01L 21/304; H01L 21/6835;
(Continued)

(56) References Cited

U.S. PATENT DOCUMENTS

2013/0059971 A1*  3/2013  Miller .................... C09J 153/00
524/553

FOREIGN PATENT DOCUMENTS

| JP | 7-150118 A | 6/1995 |
|---|---|---|
| TW | 201411742 A | 3/2014 |
| WO | 2008/045669 A1 | 4/2008 |

OTHER PUBLICATIONS

International Search Report issued in corresponding application PCT/JP2016/084800, completed Jan. 31, 2017 and dated Feb. 7, 2017.

* cited by examiner

*Primary Examiner* — Michael C Miggins
(74) *Attorney, Agent, or Firm* — Merchant & Gould, P.C.

(57) ABSTRACT

A method for manufacturing an electronic component, includes: a step of temporarily fixing onto a support body a workpiece to become a member constituting an electronic component, via a film-like temporary fixing material; a step of processing the workpiece which is temporarily fixed onto the support body; and a step of separating the processed workpiece from the support body and the film-like temporary fixing material, and the film-like temporary fixing (Continued)

material contains an (meth)acrylic copolymer (A) having a not unevenly distributed reactive functional group.

9 Claims, 6 Drawing Sheets

(51) Int. Cl.
    *H01L 21/304*     (2006.01)
    *C09D 133/08*     (2006.01)
    *C09D 133/06*     (2006.01)
    *H01L 21/683*     (2006.01)
    *B32B 27/30*     (2006.01)
    *C08K 5/3445*     (2006.01)
    *C08L 33/10*     (2006.01)
    *C08L 83/04*     (2006.01)
    *C08K 5/14*     (2006.01)
    *C08K 5/00*     (2006.01)

(52) U.S. Cl.
    CPC .......... *C08L 83/04* (2013.01); *C09D 133/066* (2013.01); *C09D 133/08* (2013.01); *H01L 21/02057* (2013.01); *H01L 21/304* (2013.01); *H01L 21/683* (2013.01); *H01L 21/6835* (2013.01); *C08K 5/0025* (2013.01); *C08K 5/14* (2013.01); *C08L 2203/20* (2013.01); *H01L 2221/68327* (2013.01); *H01L 2221/68381* (2013.01); *H01L 2221/68386* (2013.01); *H01L 2224/03002* (2013.01); *H01L 2224/05009* (2013.01); *H01L 2224/94* (2013.01); *H01L 2225/06513* (2013.01); *H01L 2225/06517* (2013.01); *H01L 2225/06541* (2013.01); *H01L 2225/06565* (2013.01)

(58) Field of Classification Search
    CPC ......... H01L 21/683; H01L 2224/05009; H01L 2225/06513; H01L 2225/06565; H01L 2224/94; H01L 2221/68386; H01L 2221/68381; H01L 2225/06541; H01L 2221/68327; H01L 2225/06517; H01L 2224/03002; C09D 133/08; C09D 133/066; C08K 5/3445; C08K 5/14; C08K 5/0025; C08L 33/10; C08L 83/04; C08L 2203/20
    See application file for complete search history.

(A)

(B)

(C)

(D)

(A)

(B)

(C)

(A)

(B)

(A)

(B)

(A)

(B)

US 10,913,248 B2

METHOD FOR MANUFACTURING ELECTRONIC COMPONENT, RESIN COMPOSITION FOR TEMPORARY FIXING, RESIN FILM FOR TEMPORARY FIXING, AND RESIN FILM SHEET FOR TEMPORARY FIXING

This is a National Phase Application in the United States of International Patent Application No. PCT/JP2016/084800 filed Nov. 24, 2016, which claims priority on Japanese Patent Application Nos. 2015-230594 and 2015-230597, filed Nov. 26, 2015. The entire disclosures of the above patent applications are hereby incorporated by reference.

TECHNICAL FIELD

The present invention relates to a method for manufacturing an electronic component, and more specifically, relates to a method for manufacturing an electronic component including a step of processing a workpiece which is temporarily fixed onto a support body by using a temporary fixing material. In addition, the present invention relates to a resin composition for temporary fixing, a resin film for temporary fixing, and a resin film sheet for temporary fixing, which are used at the time of manufacturing an electronic component.

BACKGROUND ART

In the field of the electronic component, the growth of a technology relevant to a package referred to as a system in package (SIP) in which a plurality of semiconductor elements are stacked is remarkable. In the SIP type package, a plurality of semiconductor elements are laminated, and thus, the thickness of the semiconductor element is required to be maximally small. Such a semiconductor element, for example, is preferably by building an integrated circuit in a semiconductor wafer having a constant thickness, and then, by segmenting the semiconductor wafer which is thinned by grinding a rear surface of the semiconductor wafer. The semiconductor wafer is processed by temporarily fixing the semiconductor wafer onto the support body with the temporary fixing material (for example, refer to Patent Literature 1).

A wire bonding method of the related art is a mainstream in the connection of the semiconductor element, but recently, a connection method referred to as a silicon through electrode (TSV) has attracted attention and has been actively studied. In the case of preparing a semiconductor element including a through electrode, the semiconductor wafer is thinned, and then, a process of forming the through electrode is further performed. In this case, a high temperature process of heating the semiconductor wafer up to approximately 300° C., is performed.

In addition, a method of preparing a wafer level package by flip chip mounting a semiconductor chip on the thinned semiconductor wafer has also attracted attention. In a flip chip mounting process, it is necessary to perform heating up to higher than or equal to 260° C., in order to melt a solder.

CITATION LIST

Patent Literature

Patent Literature 1: International Publication No. 2008/045669 Pamphlet

SUMMARY OF INVENTION

Technical Problem

For this reason, the temporary fixing material which is used in a manufacturing step described above is required to have adhesiveness of rigidly fixing the semiconductor wafer onto the support body at the time of grinding the semiconductor wafer and of mounting the semiconductor wafer onto the semiconductor wafer, and heat resistance in the high temperature process. On the other hand, the temporary fixing material is required to have peeling properties capable of easily separating the semiconductor wafer after processing, from the support body. In particular, it is required that the semiconductor wafer can be separated from the support body at a maximally low temperature such that damage and warpage do not occur on the semiconductor chip, and the temporary fixing material does not remain on the semiconductor wafer.

The temporary fixing material described in Patent Literature 1 tends to have insufficient heat resistance with respect to the high temperature process at the time of forming the through electrode on the semiconductor wafer and the high temperature process at the time of connecting the semiconductor wafers together, on which the through electrode is formed. In a case where the heat resistance of the temporary fixing material is not sufficient, the temporary fixing material is thermally decomposed in the high temperature process, and the semiconductor wafer is easily peeled off from the support body.

It is considered that a resin having excellent general heat resistance, such as polyimide having a high glass transition temperature (Tg), is used. However, in a case where the temporary fixing material is formed into the shape of a film in order to easily ensure flatness at the time of processing, the glass transition temperature of the resin is high, and thus, it is necessary to perform pasting at a high temperature in order to sufficiently fix the semiconductor wafer onto the support body, and there is a possibility that damage occurs on the semiconductor wafer. For this reason, the film-like temporary fixing material is required to have low temperature pasting properties capable of embedding a difference on the semiconductor wafer without a gap even in the case of being pasted at a low temperature, and of sufficiently fixing the semiconductor wafer onto the support body.

In consideration of the circumstances described above, an object of the present invention is to provide a resin composition for temporary fixing capable of forming a film-like temporary fixing material which has excellent low temperature pasting properties and sufficient heat resistance, is capable of sufficiently fixing a workpiece such as a semiconductor chip or a semiconductor wafer onto a support body, and is capable of easily separating the workpiece after processing from the support body and the temporary fixing material, and a resin film for temporary fixing and a resin film sheet for temporary fixing using the resin composition for temporary fixing.

In addition, another object of the present invention is to provide a method for manufacturing an electronic component using a film-like temporary fixing material which has sufficient heat resistance, is capable of sufficiently fixing a workpiece such as a semiconductor chip or a semiconductor wafer onto a support body, and is capable of easily separating the workpiece after processing from the support body and the temporary fixing material.

Solution to Problem

The present invention provides a first method for manufacturing an electronic component, including: a step of temporarily fixing onto a support body a workpiece to become a member constituting an electronic component, via a film-like temporary fixing material; a step of processing the workpiece which is temporarily fixed onto the support body; and a step of separating the processed workpiece from the support body and the film-like temporary fixing material, in which the film-like temporary fixing material contains an (meth)acrylic copolymer (A) having a not unevenly distributed reactive functional group.

In the present invention, the (meth)acrylic copolymer having a not unevenly distributed reactive functional group indicates a (meth)acrylic copolymer in which the reactive functional group contained in the (meth)acrylic copolymer is not unevenly distributed in a polymer chain. Furthermore, in a (meth)acrylic monomer having a reactive functional group other than a (meth)acryloyl group, a reaction rate is fast, and thus, the (meth)acrylic monomer is preferentially subjected to a reaction at the time of performing copolymerization, and as a result thereof, the reactive group is unevenly distributed in the polymer chain. The present inventors have found that a strength of the film-like temporary fixing material is improved, and heat resistance and peeling properties are improved by using the (meth)acrylic copolymer in which the reactive functional group is not unevenly distributed, compared to the case of a (meth)acrylic copolymer obtained by a synthesis method of the related art, in which a reactive group is unevenly distributed.

The film-like temporary fixing material described above contains the (meth)acrylic copolymer (A) having a not unevenly distributed reactive functional group, and thus, has sufficient heat resistance, is capable of sufficiently fixing the workpiece such as a semiconductor chip or a semiconductor wafer onto the support body, and is capable of easily separating the workpiece after processing from the support body and the temporary fixing material. Accordingly, it is possible to efficiently process the workpiece such as a semiconductor chip or a semiconductor wafer. The method for manufacturing an electronic component according to the present invention, using such a film-like temporary fixing material, is capable of efficiently manufacturing an electronic component such as an SIP type package.

In addition, the present invention provides a second method for manufacturing an electronic component, including: a step of temporarily fixing onto a support body a workpiece to become a member constituting an electronic component, via a film-like temporary fixing material; a step of processing the workpiece which is temporarily fixed onto the support body; and a step of separating the processed workpiece from the support body and the film-like temporary fixing material, in which the film-like temporary fixing material contains (i) a (meth)acrylic copolymer (i) obtained by performing living radical polymerization with respect to a polymerizable composition containing a (meth)acrylic monomer (a-1) in which a glass transition temperature of an homopolymer is higher than or equal to 50° C., a (meth) acrylic monomer (a-2) in which a glass transition temperature of an homopolymer is lower than or equal to 0° C., and a (meth)acrylic monomer (a-3) having an reactive functional group, or (ii) a (meth)acrylic copolymer (ii) obtained by performing polymerization while adding the (meth)acrylic monomer (a-3) having the reactive functional group into a polymerizable composition containing the (meth)acrylic monomer (a-1) in which the glass transition temperature of the homopolymer is higher than or equal to 50° C., and the (meth)acrylic monomer (a-2) in which the glass transition temperature of the homopolymer is lower than or equal to 0° C.

The film-like temporary fixing material contains the (meth)acrylic copolymer (i) or the (meth)acrylic copolymer (ii), and thus, has sufficient heat resistance, is capable of sufficiently fixing the workpiece such as a semiconductor chip or a semiconductor wafer onto the support body, and is capable of easily separating the workpiece after processing from the support body and the temporary fixing material. Accordingly, it is possible to efficiently process the workpiece such as a semiconductor chip or a semiconductor wafer.

In the first or second method for manufacturing an electronic component according to the present invention, the film-like temporary fixing material can be provided by laminating the (meth)acrylic copolymer (A) having a not unevenly distributed reactive functional group, or the resin film for temporary fixing containing the (meth)acrylic copolymer (i) or the (meth)acrylic copolymer (ii) on the workpiece or the support body.

Here, using a resin having excellent general heat resistance, such as polyimide having a high glass transition temperature (Tg), is considered as a method of improving heat resistance of the temporary fixing material. However, in a case where the temporary fixing material is formed into the shape of a film in order to easily ensure flatness at the time of processing, the glass transition temperature of the resin is high, and thus, it is necessary to perform pasting at a high temperature in order to sufficiently fix the semiconductor wafer onto the support body, and there is a possibility that damage occurs on the semiconductor wafer. In contrast, the resin film for temporary fixing described above contains the (meth)acrylic copolymer (A) having a not unevenly distributed reactive functional group, or the (meth)acrylic copolymer (i) or the (meth)acrylic copolymer (ii), and thus, is capable of having low temperature pasting properties capable of embedding a difference on the semiconductor wafer without a gap even in the case of being pasted at a low temperature, and of sufficiently fixing the semiconductor wafer onto the support body, and is capable of making heat resistance and low temperature pasting properties compatible in a high level. By using such a resin film for temporary fixing, it is possible to more efficiently manufacture the electronic component such as an SIP type package.

In the first method for manufacturing of an electronic component according to the present invention, it is preferable that the (meth)acrylic copolymer (A) having a not unevenly distributed reactive functional group contained in the film-like temporary fixing material, contains a (meth) acrylic monomer (a-1) in which a glass transition temperature of an homopolymer is higher than or equal to 50° C., a (meth)acrylic monomer (a-2) in which a glass transition temperature of an homopolymer is lower than or equal to 0° C., and a (meth)acrylic monomer (a-3) having an reactive functional group, as a copolymer component, from the viewpoint of improving heat resistance and peeling properties.

In the first or second method for manufacturing an electronic component according to the present invention, it is preferable that the (meth)acrylic monomer (a-2) in which the glass transition temperature of the homopolymer is lower than or equal to 0° C., is a (meth)acrylic monomer having an alkyl group of which the number of carbon atoms is 6 to 20, from the viewpoint of improving peeling properties.

In the first or second method for manufacturing an electronic component according to the present invention, it is preferable that the reactive functional group contained in the (meth)acrylic copolymer (A) having a not unevenly distributed reactive functional group, or the reactive functional group of the (meth)acrylic monomer (a-3) having the reactive functional group is an epoxy group, from the viewpoint of improving heat resistance.

In this case, the film-like temporary fixing material described above is capable of further containing an epoxy curing agent (B), from the viewpoint of improving curing properties, heat resistance, and peeling properties.

It is preferable that the epoxy curing agent (B) described above is an imidazole-based curing agent, from the viewpoint of further improving the curing properties.

In the first or second method for manufacturing an electronic component according to the present invention, the film-like temporary fixing material described above is capable of further containing a silicone compound (C), from the viewpoint of improving peeling properties of the film-like temporary fixing material. In this case, it is possible to easily separate the workpiece after processing from the support body and the temporary fixing material without using a solvent.

It is preferable that the silicone compound (C) described above is a silicone modified alkyd resin, from the viewpoint of improving compatibility with respect to the component (A), or the component (i) or the component (ii), and heat resistance and peeling properties of the film-like temporary fixing material.

In the first or second method for manufacturing an electronic component according to the present invention, the film-like temporary fixing material described above can be formed of two or more layers, and at least a layer in contact with the workpiece is capable of containing the component (A) described above, or the component (i) described above or the component (ii) described above. In this case, it is possible to have a difference in a peeling strength or an elastic modulus on each layer, and thus, it is possible to selectively peel off a peeling interface.

In addition, the present invention provides a first resin composition for temporary fixing for forming a film-like temporary fixing material which is used for manufacturing an electronic component, in which a method for manufacturing the electronic component includes a step of temporarily fixing onto a support body a workpiece to become a member constituting an electronic component, via the film-like temporary fixing material, a step of processing the workpiece which is temporarily fixed onto the support body, and a step of separating the processed workpiece from the support body and the film-like temporary fixing material, and the film-like temporary fixing material contains an (meth)acrylic copolymer (A) having a not unevenly distributed reactive functional group.

In addition, the present invention provides a second resin composition for temporary fixing for forming a film-like temporary fixing material which is used for manufacturing an electronic component, in which a method for manufacturing the electronic component includes a step of temporarily fixing onto a support body a workpiece to become a member constituting an electronic component, via the film-like temporary fixing material, a step of processing the workpiece which is temporarily fixed onto the support body, and a step of separating the processed workpiece from the support body and the film-like temporary fixing material, and the resin composition for temporary fixing contains, (i) a (meth)acrylic copolymer (i) obtained by performing living radical polymerization with respect to a polymerizable composition containing a (meth)acrylic monomer (a-1) in which a glass transition temperature of an homopolymer is higher than or equal to 50° C., a (meth)acrylic monomer (a-2) in which a glass transition temperature of an homopolymer is lower than or equal to 0° C., and a (meth)acrylic monomer (a-3) having an reactive functional group, or (ii) a (meth)acrylic copolymer (ii) obtained by performing polymerization while adding the (meth)acrylic monomer (a-3) having the reactive functional group into a polymerizable composition containing the (meth)acrylic monomer (a-1) in which the glass transition temperature of the homopolymer is higher than or equal to 50° C., and the (meth)acrylic monomer (a-2) in which the glass transition temperature of the homopolymer is lower than or equal to 0° C.

According to the first and second resin compositions for temporary fixing according to the present invention, it is possible to form a film-like temporary fixing material which has excellent low temperature pasting properties and sufficient heat resistance, and is capable of sufficiently fixing the workpiece such as a semiconductor chip or a semiconductor wafer onto the support body. The film-like temporary fixing material is capable of easily separating the workpiece after processing from the support body, and of being easily peeled off from the workpiece after processing, and thus, it is possible to easily separate the workpiece after processing from the support body and the temporary fixing material.

In the first resin composition for temporary fixing according to the present invention, it is preferable that the (meth)acrylic copolymer (A) having a not unevenly distributed reactive functional group contains a (meth)acrylic monomer (a-1) in which a glass transition temperature of an homopolymer is higher than or equal to 50° C., a (meth)acrylic monomer (a-2) in which a glass transition temperature of an homopolymer is lower than or equal to 0° C., and a (meth)acrylic monomer (a-3) having an reactive functional group, as a copolymer component, from the viewpoint of improving heat resistance and peeling properties.

In the first or second resin composition for temporary fixing according to the present invention, it is preferable that the (meth)acrylic monomer (a-2) in which the glass transition temperature of the homopolymer is lower than or equal to 0° C., is a (meth)acrylic monomer having an alkyl group of which the number of carbon atoms is 6 to 20, from the viewpoint of improving peeling properties.

In the first or second resin composition for temporary fixing according to the present invention, it is preferable that the reactive functional group contained in the (meth)acrylic copolymer (A) having a not unevenly distributed reactive functional group, or the reactive functional group of the (meth)acrylic monomer (a-3) having the reactive functional group is an epoxy group, from the viewpoint of improving heat resistance.

The first or second resin composition for temporary fixing according to the present invention is capable of further containing an epoxy curing agent (B), from the viewpoint of improving curing properties, heat resistance, and peeling properties.

It is preferable that the epoxy curing agent (B) described above is an imidazole-based curing agent, from the viewpoint of further improving the curing properties.

The first or second resin composition for temporary fixing according to the present invention is capable of further containing a silicone compound (C), from the viewpoint of improving peeling properties of the film-like temporary fixing material to be formed. In this case, it is possible to easily separate the workpiece after processing from the support body and the temporary fixing material without using a solvent.

It is preferable that the silicone compound (C) described above is a silicone modified alkyd resin, from the viewpoint of improving compatibility with respect to the component (A), or the component (i) or the component (ii), and heat resistance and peeling properties of the film-like temporary fixing material to be formed.

In addition, the present invention provides a resin film for temporary fixing configured by forming first or second resin composition for temporary fixing according to the present invention into the shape of a film. By using such a resin film for temporary fixing, it is possible to efficiently process the workpiece such as a semiconductor chip or a semiconductor wafer. Accordingly, it is possible to efficiently manufacture an electronic component such as an SIP type package.

In addition, the present invention provides a first resin film sheet for temporary fixing, including: a support film; and the first or the second resin film for temporary fixing according to the present invention, which is disposed on the support film. According to the first resin film sheet for temporary fixing according to the present invention, it is possible to easily transfer the resin film for temporary fixing according to the present invention onto the workpiece or the support body, and to efficiently process the workpiece.

In addition, the present invention provides a second resin film sheet for temporary fixing, including: a support film; a first thermoplastic resin layer configured by forming the first or the second resin composition for temporary fixing according to the present invention, which is disposed on the support film, into the shape of a film; and a second thermoplastic resin layer disposed on the first thermoplastic resin layer. According to the second resin film sheet for temporary fixing according to the present invention, it is possible to have a difference in a peeling strength or an elastic modulus on each layer, and thus, it is possible to selectively peel off a peeling interface.

Advantageous Effects of Invention

According to the present invention, it is possible to provide a method for manufacturing an electronic component using a film-like temporary fixing material which has sufficient heat resistance, is capable of sufficiently fixing the workpiece such as a semiconductor chip or a semiconductor wafer onto the support body, and is capable of easily separating the workpiece after processing from the support body and the temporary fixing material.

In addition, according to the present invention, it is possible to provide a resin composition for temporary fixing for forming a film-like temporary fixing material, which has excellent low temperature pasting properties and sufficient heat resistance, is capable of sufficiently fixing the workpiece such as a semiconductor chip or a semiconductor wafer onto the support body, and is capable of easily separating the workpiece after processing from the support body and the temporary fixing material, and a resin film for temporary fixing and a resin film sheet for temporary fixing using the resin composition for temporary fixing.

DESCRIPTION OF EMBODIMENTS

Figure 1:
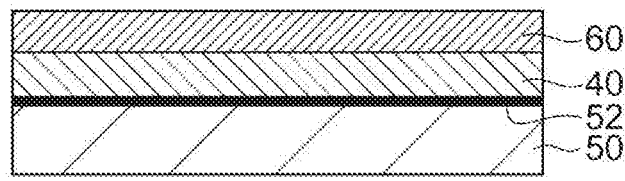
FIG. 1(A), FIG. 1(B), and FIG. 1(C) are schematic sectional views for illustrating one embodiment of a processing method of a semiconductor wafer according to the present invention.
FIG. 1(D) is a top view illustrating a semiconductor wafer after processing.
Figure 1:
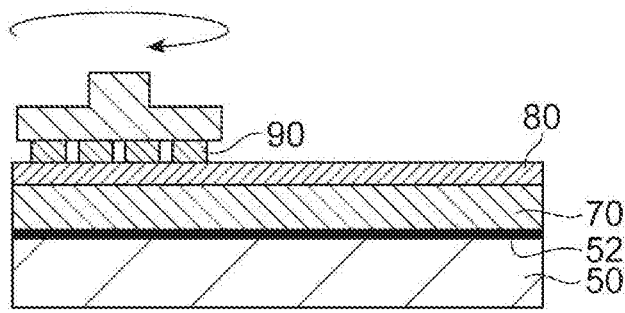
Figure 1:
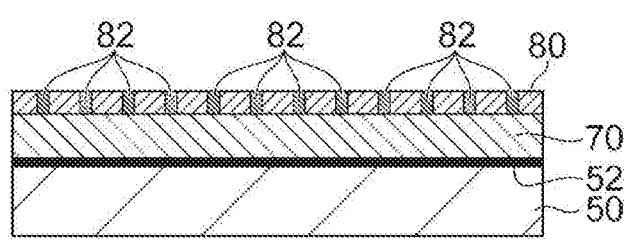
Figure 1:
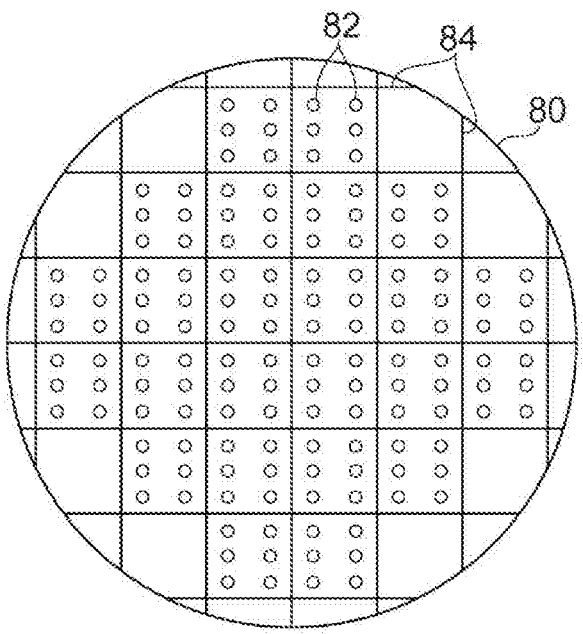

Hereinafter, preferred embodiments of the present invention will be described in detail with reference to the drawings. Furthermore, in the drawings, the same reference numerals will be applied to the same or the corresponding portions, and the repeated description will be omitted. In addition, a dimension ratio of the drawings is not limited to the illustrated ratio.

A method for manufacturing an electronic component of this embodiment, includes: a step of temporarily fixing onto a support body a workpiece to become a member constituting an electronic component, via a film-like temporary fixing material; a step of processing the workpiece which is temporarily fixed onto the support body; and a step of separating the processed workpiece from the support body and the film-like temporary fixing material.

[Semiconductor Wafer Processing Method]

A processing method of a semiconductor wafer will be described below, as an example of the method for manufacturing an electronic component according to this embodiment. The processing method of the semiconductor wafer of this embodiment broadly includes four steps described below. The processing method includes (a) a temporary fixing step of temporarily fixing a semiconductor wafer onto a support body via a film-like temporary fixing material, (b) a processing step of processing the semiconductor wafer which is temporarily fixed onto the support body, (c) a separating step of separating the processed semiconductor wafer from the support body and the film-like temporary fixing material, and (d) a washing step of performing washing in a case where there is residual dross on the semiconductor wafer.

FIG. 1(A), FIG. 1(B), and FIG. 1(C) are schematic sectional views for illustrating one embodiment of the processing method of the semiconductor wafer, and FIG. 1(D) is a top view illustrating the semiconductor wafer after processing.

<(a) Temporary Fixing Step>

FIG. 1(A) illustrates a step of interposing a film-like temporary fixing material 40 formed of the resin composition for temporary fixing or the resin film for temporary fixing according to this embodiment, between a support body 50 and a semiconductor wafer 60, and of temporarily fixing the semiconductor wafer 60 onto the support body 50.

The thickness of the semiconductor wafer 60 is not particularly limited, and can be 600 μm to 800 μm.

In the case of using the resin composition for temporary fixing, the film-like temporary fixing material 40 can be formed on an element formation surface of the semiconductor wafer 60 according to a method such as spin coating or on the support body. In a case where the resin composition for temporary fixing is diluted by an organic solvent, the organic solvent is removed by heating and drying, according to a volatilization condition of the solvent, after spin coating, and thus, the film-like temporary fixing material 40 is formed.

The resin film for temporary fixing is laminated on the element formation surface of the semiconductor wafer 60 or on the support body by using the resin film for temporary fixing formed of the resin composition for temporary fixing (for example, a resin film 20 for temporary fixing in resin film sheets 1 and 2 for temporary fixing illustrated in FIGS. 4 and 5 described below), and by using a roll laminator, a vacuum laminator, and the like, and thus, the film-like temporary fixing material 40 can be disposed, from the viewpoint of an efficiency.

Next, the semiconductor wafer 60 on which the film-like temporary fixing material 40 is formed, is set on a wafer bonding device or a vacuum laminator, and the support body 50 is pressed by a press, and is pasted. Furthermore, in a case where the film-like temporary fixing material 40 is formed on the support body 50 side, the support body 50 on which the film-like temporary fixing material 40 is disposed, is set on the wafer bonding device or the vacuum laminator, and the semiconductor wafer 60 is pressed by a press, and is pasted.

In the case of using the wafer bonding device, for example, the semiconductor wafer 60 is temporarily fixed onto the support body 50 via the film-like temporary fixing material 40 at an atmospheric pressure of less than or equal to 1 hPa, a crimping pressure of 1 MPa, and a crimping temperature of 60° C. to 200° C., for retaining time of 100 seconds to 300 seconds, by using a vacuum pressing machine EVG520IS (Product Name), manufactured by EV Group.

In the case of using the vacuum laminator, for example, the semiconductor wafer 60 is temporarily fixed onto the support body 50 via the film-like temporary fixing material 40 at an atmospheric pressure of less than or equal to 1 hPa, a crimping temperature of 40° C. to 180° C., of preferably 60° C. to 150° C., and a lamination pressure of 0.01 MPa to 0.5 MPa, of preferably 0.1 MPa to 0.5 MPa, for retaining time of 1 second to 600 seconds, or preferably 30 seconds to 300 seconds, by using a vacuum laminator LM-50×50-S (Product Name), manufactured by NPC Incorporated, and a vacuum laminator V130 (Product Name), manufactured by Nichigo Morton Co., Ltd.

The semiconductor wafer 60 is temporarily fixed onto the support body 50 via the film-like temporary fixing material 40, and then, heating is performed at 100° C. to 200° C. for 5 minutes to 120 minutes, and thus, thermal curing of the film-like temporary fixing material 40 is performed.

A material of the support body of this embodiment is not particularly selected, and substrate such as a silicon wafer, a glass wafer, and a quartz wafer can be used.

The support body of this embodiment may be subjected to a peeling treatment, or as illustrated in FIG. 1(A), the entire front surface of a part of the front surface of the support body 50 is subjected to the peeling treatment, and thus, a peeling layer 52 can be formed. A peeling agent used for the peeling treatment is not particularly limited, and for example, a surface modifier having a fluorine element, polyolefin-based wax and silicone oil, silicone oil having an epoxy group, and a silicone modified alkyd resin are preferable, from the viewpoint of excellent peeling properties.

In the case of using the film-like temporary fixing material according to this embodiment described below, the semiconductor wafer can be processed at a high temperature by using the support body, and the resin composition for temporary fixing can be peeled off from the semiconductor wafer and the support body at a room temperature, after processing, without an adhesive deposit.

<(b) Processing Step>

The processing step includes grinding used at a wafer level, electrode formation, metal wiring formation, protective film formation, and the like. A grinding method is not particularly limited, and a known grinding method can be used. It is preferable that the grinding is performed while cooling the semiconductor wafer and a grinding stone (diamond or the like) with water.

For example, as illustrated in FIG. 1(B), a rear surface of a semiconductor wafer 80, that is, a surface of the semiconductor wafer 80 on a side opposite to a side in contact with a film-like temporary fixing material 70 is ground by a grinder 90, and for example, a thickness of approximately 700 μm is thinned to be less than or equal to 100 μm.

For example, DGP-8761 (Product Name), manufactured by DISCO Corporation, or the like is exemplified as a device performing grinding processing, and in this case, a cutting condition can be arbitrarily selected according to a desired thickness and a grinding state of the semiconductor wafer.

Specifically, the other step includes a known process such as metal sputtering for forming an electrode or the like, wet etching for etching a metal sputtering layer, pattern formation according to coating, exposure, and development of a resist for metal wiring formation, resist peeling, dry etching, metal plating formation, silicon etching for TSV formation, and oxide film formation on a silicon front surface. Further, a step of laminating another semiconductor chip or wafer on the temporarily fixed semiconductor wafer, and a step of sealing the temporarily fixed semiconductor wafer by using a sealing material can also be included in the other step.

FIG. 1(C) illustrates an example in which the rear surface side of the thinned semiconductor wafer 80 is subjected to processing such as dry ion etching or a Bosch process, and a through hole is formed, and then, a treatment such as copper plating is performed, and thus, a through electrode 82 is formed.

Thus, the semiconductor wafer 80 is subjected to predetermined processing. FIG. 1(D) is a top view of the semiconductor wafer 80 after processing. The through electrode 82 is formed on the processed semiconductor wafer 80, and the semiconductor wafer 80 is diced along a dicing line 84, and thus, is segmented into a semiconductor element.

<(c) Separating Step>

Figure 2:
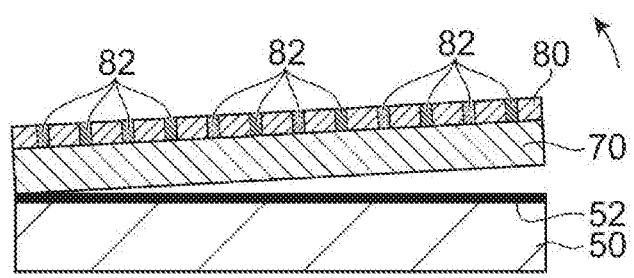
FIG. 2 is a schematic sectional view for illustrating one embodiment of a manufacturing method of a separating step of separating the processed semiconductor wafer according to the present invention from a support body and a film-like temporary fixing material.
Figure 2:
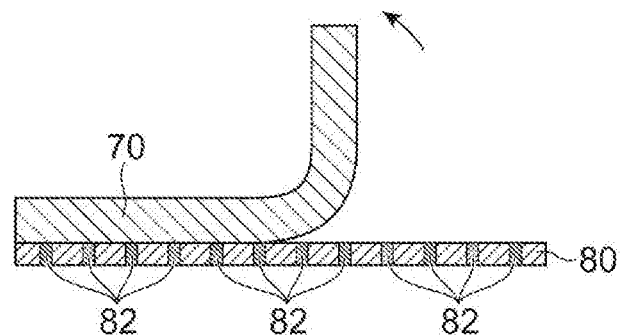
Figure 2:

FIG. 2 is a schematic sectional view for illustrating one embodiment of the separating step of separating the processed semiconductor wafer from the support body and the film-like temporary fixing material. The separating step according to this embodiment includes a first peeling step of peeling off the semiconductor wafer from the support body, and a second peeling step of peeling off the film-like temporary fixing material from the semiconductor wafer. The first peeling step is a step of peeling off the semiconductor wafer which is processed in the processing step, from the support body, that is, a step of performing various processings with respect to the thinned semiconductor wafer, and then, of peeling off the semiconductor wafer from the support body before dicing. A method of separating the semiconductor wafer and the support body from each other by sliding the semiconductor wafer and the support body in opposite directions along a horizontal direction while mainly heating the semiconductor wafer and the support body (preferably 200° C. to 250° C.), a method of horizontally fixing one of the semiconductor wafer of the support body and the support body, and of lifting the other one from the horizontal direction at a constant angle, and a method of pasting a protective film onto the ground surface of the ground semiconductor wafer, and of peeling off the semiconductor wafer and the protective film from the support body in a peeling manner, and the like are exemplified as a peeling method, and can be adopted without any particular limitation.

All of the peeling methods can be applied to this embodiment, but the method of horizontally fixing one of the semiconductor wafer 80 of the support body and the support body 50 as illustrated in FIG. 1(A), and of lifting the other one from the horizontal direction at a constant angle, and a method of pasting the protective film onto the ground surface of the ground semiconductor wafer, and of peeling off the semiconductor wafer and the protective film in the peeling manner are more preferable. In general, such peeling methods are performed at a room temperature, or may be performed at a temperature of approximately 40° C. to 100° C. where damage does not occur on the semiconductor wafer. When decomposition is mechanically performed, for example, De-Bonding device EVG805EZD manufactured by EV Group, can be used.

In the second peeling step, for example, as illustrated in FIG. 2(B), the semiconductor wafer 80 is horizontally fixed, and an end of the film-like temporary fixing material 70 are lifted from the horizontal direction at a constant angle, and thus, the semiconductor wafer 80 from which the film-like temporary fixing material is peeled off, can be obtained (refer to FIG. 2(C)). In this embodiment, the film-like temporary fixing material is formed by using a resin composition for temporary fixing according to this embodiment described below, and thus, it is possible to easily obtain the processed semiconductor wafer in which residual dross such as an adhesive deposit is sufficiently reduced.

In this embodiment, in the first peeling step, separation may be performed between the semiconductor wafer and the film-like temporary fixing material.

<(d) Cleaning Step>

A part of the temporary fixing material easily remains on a circuit formation surface of the semiconductor wafer. In a case where a part of the temporary fixing material remains on the circuit formation surface of the peeled semiconductor wafer, the washing step for removing the remaining temporary fixing material can be provided. The temporary fixing material can be removed, for example, by washing the semiconductor wafer.

A washing liquid to be used is not particularly limited, insofar as being a washing liquid capable of removing the remaining temporary fixing material, and for example, the organic solvent described above, which can be used for diluting the resin composition for temporary fixing, is exemplified. Only one type or two or more types of such organic solvents can be used in combination.

In addition, in a case where it is difficult to remove the remaining temporary fixing material, bases and acids may be added to the organic solvent. Amines such as ethanol amine, diethanol amine, triethanol amine, triethyl amine, and ammonia; and ammonium salts such as tetramethyl ammonium hydroxide can be used as an example of the bases. An organic acid such as an acetic acid, an oxalic acid, a benzene sulfonic acid, and a dodecyl benzene sulfonic acid can be used as the acids. It is preferable that an additive amount is 0.01 mass % to 10 mass % at a concentration in the washing liquid. In addition, in order to improve removability of the residue, the existing surfactant may be added.

A washing method is not particularly limited, and for example, a method of performing washing with a paddle by using the washing liquid described above, a washing method with spray atomization, and a method of performing dipping in a washing liquid bath are exemplified. A temperature is preferably 10° C. to 80° C., and is more preferably 15° C. to 65° C., and finally, water washing or alcohol washing is performed, and a drying treatment is performed, and thus, a thin semiconductor wafer 80 is obtained.

Furthermore, according to the resin composition for temporary fixing according to this embodiment, it is possible to sufficiently reduce residual dross such as an adhesive deposit, and thus, it is possible to omit the washing step.

As described above, the through electrode 82 is formed on the processed semiconductor wafer 80, and the semiconductor wafer 80 is segmented into a semiconductor element along the dicing line 84 (refer to FIG. 1(D)).

In this embodiment, the obtained semiconductor element is in contact with the other semiconductor element or a substrate for mounting a semiconductor element, and thus, it is possible to manufacture a semiconductor device.

Figure 3:
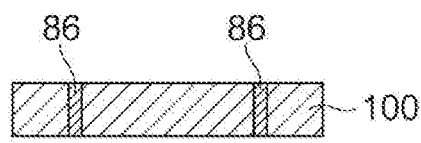
FIG. 3 is a schematic sectional view for illustrating one embodiment of a method for manufacturing an electronic component according to the present invention.
Figure 3:
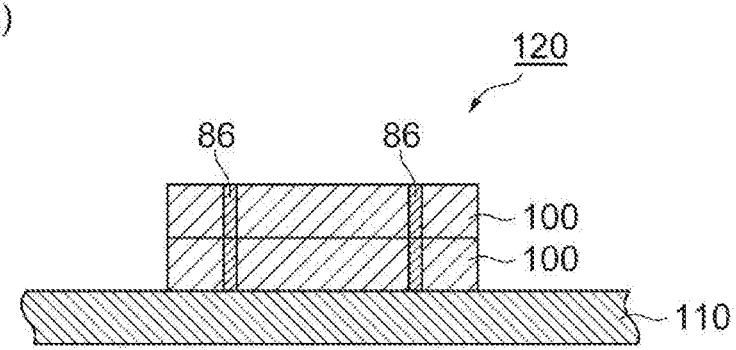

FIG. 3 is a schematic sectional view for illustrating one embodiment of a method for manufacturing a semiconductor device. First, according to the method described above, a through electrode 86 is formed, and a segmented semiconductor element 100 is prepared (FIG. 3(A)). Then, a plurality of semiconductor elements 100 are laminated on a wiring substrate 110, and thus, it is possible to obtain a semiconductor device 120 (FIG. 3(B)).

[Resin Composition for Temporary Fixing]

The resin composition for temporary fixing according to this embodiment is a resin composition for temporary fixing for forming a film-like temporary fixing material which is used in the method for manufacturing an electronic component of this embodiment, described above, and contains an (meth)acrylic copolymer (A) having a not unevenly distributed reactive functional group (also referred to as an component (A)). The resin composition for temporary fixing of this embodiment can be cured by heating.

Furthermore, herein, (meth)acryl indicates any one of acryl and methacryl.

It is preferable that the (meth)acrylic copolymer (A) having a not unevenly distributed reactive functional group contains a (meth)acrylic monomer (a-1) in which a glass transition temperature of an homopolymer is higher than or equal to 50° C., a (meth)acrylic monomer (a-2) in which a glass transition temperature of an homopolymer is lower than or equal to 0° C., and a (meth)acrylic monomer (a-3) having an reactive functional group, as a copolymer component. It is possible to make heat resistance of the film-like temporary fixing material formed of the resin composition for temporary fixing excellent by containing the (meth)acrylic monomer (a-1) in which the glass transition temperature of the homopolymer is higher than or equal to 50° C., it is possible to make low temperature pasting properties and peeling properties excellent by containing the (meth)acrylic monomer (a-2) in which the glass transition temperature of the homopolymer is lower than or equal to 20° C., and it is possible to make heat resistance excellent by containing the (meth)acrylic monomer (a-3) having the reactive functional group.

The glass transition temperature of the homopolymer is known from various literatures, catalogs, and the like, and for example, is described in J. Brandup, E. H. Immergut, E. A. Grulke: Polymer Handbook. 4th Ed., John Wiley & Sons, 2003. A value measured by differential scanning calorimetry (DSC) or the like can be used for a monomer not described in various literatures.

For example, methyl methacrylate (105° C.), ethyl methacrylate (65° C.), t-butyl methacrylate (107° C.), cyclohexyl methacrylate (66° C.), adamantyl acrylate (153° C.), adamantyl methacrylate (183° C.), isobornyl acrylate (94° C.), isobornyl methacrylate (180° C.), dicyclopentanyl acrylate (120° C.), dicyclopentanyl methacrylate (175° C.), benzyl methacrylate (54° C.), tetrahydrofurfuryl methacrylate (60° C.), and the like are exemplified as the (meth)acrylic monomer (a-1) in which the glass transition temperature of the homopolymer is higher than or equal to 50° C. Only one type or two or more types of such compounds can be used in combination. Furthermore, the temperature in parentheses indicates the glass transition temperature of the homopolymer.

A (meth)acrylic monomer in which a glass transition temperature of a homopolymer is higher than or equal to 70° C., is more preferable, and a (meth)acrylic monomer in which a glass transition temperature of a homopolymer is higher than or equal to 90° C., is even more preferable, as the (meth)acrylic monomer (a-1) in which the glass transition temperature of the homopolymer is higher than or equal to 50° C., from the viewpoint of heat resistance.

The (meth)acrylic copolymer (A) having a not unevenly distributed reactive functional group contains the (meth)acrylic monomer (a-1) in which the glass transition temperature of the homopolymer is higher than or equal to 50° C., by preferably 5 mass % to 70 mass %, more preferably 10 mass % to 60 mass %, and even more preferably 15 mass % to 50 mass %, on the basis of the total amount of the copolymerization component, as the copolymerization component. In a case where the content of the (meth)acrylic monomer (a-1) in which the glass transition temperature of the homopolymer is higher than or equal to 50° C., is greater than or equal to 5 mass %, it is possible to make heat resistance of the film-like temporary fixing material formed of the resin composition for temporary fixing excellent, and in a case where the content is less than or equal to 70 mass %, it is possible to make the low temperature pasting properties more excellent.

For example, ethyl acrylate (−22° C.), propyl acrylate (−37° C.), isopropyl acrylate (−3° C.), butyl acrylate (−49° C.), isobutyl acrylate (−24° C.), s-butyl acrylate (−22° C.), hexyl acrylate (−57° C.), hexyl methacrylate (−5° C.), heptyl acrylate (−60° C.), octyl acrylate (−65° C.), 2-ethyl hexyl acrylate (−50° C.), 2-ethyl hexyl methacrylate (−10° C.), isooctyl acrylate (−58° C.), nonyl acrylate (−58° C.), isononyl acrylate (−58° C.), decyl methacrylate (−70° C.), isodecyl methacrylate (−41° C.), lauryl acrylate (−3° C.), lauryl methacrylate (−65° C.), isostearyl acrylate (−18° C.), 2-methoxy ethyl acrylate (−50° C.), tetrahydrofurfuryl acrylate (−12° C.), and the like are exemplified as the (meth)acrylic monomer (a-2) in which the glass transition temperature of the homopolymer is lower than or equal to 0° C. Only one type or two or more types of such compounds can be used in combination. Furthermore, the temperature in parentheses indicates the glass transition temperature of the homopolymer.

A (meth)acrylic monomer in which a glass transition temperature of a homopolymer is lower than or equal to −10° C., is preferable, and a (meth)acrylic monomer in which a glass transition temperature of a homopolymer is lower than or equal to −20° C., is more preferable, as the (meth)acrylic monomer (a-2) in which the glass transition temperature of the homopolymer is less than or equal to 0° C., from the viewpoint of low temperature pasting properties and peeling properties.

Further, it is preferable that the (meth)acrylic monomer (a-2) in which the glass transition temperature of the homopolymer is less than or equal to 0° C., is a (meth)acrylic monomer having an alkyl group of which the number of carbon atoms is 6 to 20, from the viewpoint of improving peeling properties. For example, hexyl acrylate (−57° C.), hexyl methacrylate (−5° C.), heptyl acrylate (−60° C.), octyl acrylate (−65° C.), 2-ethyl hexyl acrylate (−50° C.), 2-ethyl hexyl methacrylate (−10° C.), isooctyl acrylate (−58° C.), nonyl acrylate (−58° C.), isononyl acrylate (−58° C.), decyl methacrylate (−70° C.), isodecyl methacrylate (−41° C.), lauryl acrylate (−3° C.), lauryl methacrylate (−65° C.), isostearyl acrylate (−18° C.), and the like are exemplified as such a monomer. Only one type or two or more types of such compounds can be used in combination. Furthermore, the temperature in parentheses indicates the glass transition temperature of the homopolymer.

The (meth)acrylic copolymer (A) having a not unevenly distributed reactive functional group contains the (meth)acrylic monomer (a-2) in which the glass transition temperature of the homopolymer is less than or equal to 0° C., by preferably 20 mass % to 90 mass %, more preferably 30 mass % to 85 mass %, and even more preferably 40 mass % to 70 mass %, on the basis of the total amount of the copolymerization component, as the copolymerization component. In a case where the content of the (meth)acrylic monomer (a-2) in which the glass transition temperature of the homopolymer is less than or equal to 0° C. is greater than or equal to 20 mass %, it is possible to make low temperature pasting properties and peeling properties of the film-like temporary fixing material formed of the resin composition for temporary fixing excellent, and in a case where the content is less than or equal to 90 mass %, it is possible to make the heat resistance more excellent.

For example, an epoxy group, an oxetanyl group, a carboxyl group, a hydroxy group, an amide group, an amino group, and the like are exemplified as the reactive functional group contained in the (meth)acrylic monomer (a-3) having the reactive functional group. Among them, the epoxy group, the carboxyl group, and the hydroxy group are preferable, and the epoxy group is more preferable, from the viewpoint of improving heat resistance. Only one type or two or more types of such functional groups can be used in combination.

For example, glycidyl (meth)acrylate, 4-hydroxy butyl (meth)acrylate glycidyl ether, and 3,4-epoxy cyclohexyl methyl (meth)acrylate are exemplified as a (meth)acrylic monomer having an epoxy group. Only one type or two or more types of such compounds can be used in combination. Among them, it is preferable that the (meth)acrylic monomer having an epoxy group is glycidyl (meth)acrylate, from the viewpoint of heat resistance.

It is preferable that the (meth)acrylic copolymer (A) having a not unevenly distributed reactive functional group contains the (meth)acrylic monomer (a-3) having the reactive functional group by 3 mass % to 50 mass %, on the basis of the total amount of the copolymerization component, as the copolymerization component. The content of the (meth)acrylic monomer (a-3) having the reactive functional group is preferably 5 mass % to 40 mass %, and is more preferably 10 mass % to 30 mass %, on the basis of the total amount of the copolymerization component. In a case where the content of the (meth)acrylic monomer (a-3) having the reactive functional group is greater than or equal to 3 mass %, it is possible to make heat resistance of the film-like temporary fixing material formed of the resin composition for temporary fixing excellent, and in a case where the content is less than or equal to 50 mass %, it is possible to suppress a reaction between the reactive functional groups during the preservation of the resin composition for temporary fixing, and thus, it is possible to obtain sufficient preservation stability.

Radical polymerization can be used for synthesizing the (meth)acrylic copolymer (A) having a not unevenly distributed reactive functional group. For example, a solution polymerization method, a suspension polymerization method, a bulk polymerization method, and the like are exemplified as a radical polymerization method, and the suspension polymerization method is more preferable. In the solution polymerization method, it is difficult to increase the molecular weight, and in the bulk polymerization method, it is not industrially easy to perform thermal control.

In order to obtain the (meth)acrylic copolymer without having an unevenly distributed reactive functional group, it is preferable to use living radical polymerization in the radical polymerization. Accordingly, a copolymer is obtained in which a (meth)acrylic monomer having a reactive functional group with a high reaction rate is not unevenly distributed, compared to general radical polymerization. In this case, it is more preferable that the (meth)acrylic monomer having a reactive functional group with a high reaction rate is added later. Accordingly, the copolymer is more easily obtained in which the (meth)acrylic monomer having a reactive functional group with a high reaction rate is not unevenly distributed.

In the living radical polymerization, atom transfer radical polymerization (ATRP polymerization), reversible addition-fragmentation chain transfer polymerization (RAFT polymerization), and the like are known, and any method can be used, but it is preferable to perform polymerization by the RAFT polymerization.

In the RAFT polymerization, a polymerization initiator and a reversible addition-fragmentation chain transfer agent (hereinafter, referred to as an RAFT agent) are used. Such polymerization is excellent in productivity, compared to the other living radical polymerization, from the viewpoint that the polymerization can be applied to various monomers, and can be applied to a wide range of reaction conditions.

Dithiocarbonates such as O-ethyl-S-(1-phenyl ethyl) dithiocarbonate, O-ethyl-S-(2-propoxy ethyl) dithiocarbonate, and O-ethyl-S-(1-cyano-1-methyl ethyl) dithiocarbonate, dithioesters such as cyanoethyl dithiopropionate, benzyl dithiopropionate, benzyl dithiobenzoate, and acetoxy ethyl dithiobenzoate, dithiocarbamates such as S-benzyl-N,N-dimethyl dithiocarbamate and benzyl-1-pyrrol carbodithioate, and trithiocarbonates such as dibenzyl trithiocarbonate and S-cyanomethyl-S-dodecyl trithiocarbonate are exemplified as the RAFT agent.

It is preferable that an optimal RAFT agent is selected according to reactivity of a monomer, as the RAFT agent to be used, and in particular, dithiocarbamates and dithiocarbonates are preferable for polymerization of acrylic acid ester, and dithioesters are preferable for polymerization of methacrylic acid ester.

A use amount of the RAFT agent is preferably 0.01 parts by mass to 10 parts by mass, and is more preferably 0.05 parts by mass to 3 parts by mass, with respect to 100 parts by mass of the total amount of the monomer. In a case where the use amount is greater than or equal to 0.01 parts by mass, it is easy to control the reaction, and in a case where the use amount is less than or equal to 10 parts by mass, the molecular weight does not excessively decrease.

In the case of using the suspension polymerization method in order to obtain the (meth)acrylic copolymer without having an unevenly distributed reactive functional group, the (meth)acrylic monomer having a reactive functional group with a high reaction rate may be added and polymerized while heating and stirring a dispersion liquid obtained by adding a (meth)acrylic monomer, a polymerization initiator, and water, in order for the (meth)acrylic monomer having a reactive functional group with a high reaction rate not to be unevenly distributed. The addition may be continuously performed while performing heating and stirring, or may be performed by being divided into several times, at intervals.

For example, organic peroxide such as benzoyl peroxide, lauroyl peroxide, di-t-butyl peroxyhexahydroterephthalate, t-butyl peroxy-2-ethyl hexanoate, 1,1-t-butyl peroxy-3,3,5-trimethyl cyclohexane, and t-butyl peroxyisopropyl carbonate, and an azo compound such as azobisisobutyronitrile, azobis-4-methoxy-2,4-dimethyl valeronitrile, azobiscyclohexanone-1-carbonitrile, and azodibenzoyl are exemplified as a radical polymerization initiator.

The polymerization initiator is used in a range of preferably 0.01 parts by mass to 10 parts by mass, more preferably 0.05 parts by mass to 5 parts by mass, and even more preferably 0.1 parts by mass to 3 parts by mass, with respect to 100 parts by mass of the total amount of (meth)acrylic monomer, as a compounding amount of the polymerization initiator. In a case where the compounding amount of the polymerization initiator is greater than or equal to 0.01 parts by mass, the polymerization sufficiently progresses, and in a case where the compounding amount is less than or equal to 10 parts by mass, the molecular weight does not excessively decrease.

In the case of using the suspension polymerization method, a suspension agent may be added into an aqueous medium. For example, a water-soluble polymer such as polyvinyl alcohol, methyl cellulose, and polyacryl amide, and a poorly-soluble inorganic substance such as calcium phosphate and magnesium pyrophosphate are exemplified as the suspension agent, and among them, a non-ionic water-soluble polymer such as polyvinyl alcohol is preferable. In the case of using an ionic water-soluble polymer or the poorly-soluble inorganic substance, a great amount of ionic impurities tend to remain in the obtained resin composition. It is preferable that the water-soluble polymer is used by 0.01 parts by mass to 1 part by mass, with respect to 100 parts by mass of the total amount of a monomer mixture.

A mercaptan-based compound, thioglycol, carbon tetrachloride, and an α-methyl styrene dimer can be added as a molecular weight modifier to be used for the suspension polymerization, as necessary.

Even in the case of using the solution polymerization method in order to obtain the (meth)acrylic copolymer without having an unevenly distributed reactive functional group, as with the suspension polymerization method described above, the (meth)acrylic monomer having a reactive functional group with a high reaction rate may be added and polymerized, in order for the (meth)acrylic monomer having a reactive functional group with a high reaction rate not to be unevenly distributed. The addition may be continuously performed while performing heating and stirring, or may be performed by being divided into several times, at intervals.

For example, a ketone-based organic solvent such as acetone, methyl ethyl ketone, methyl isobutyl ketone, and cyclohexanone; an ester-based organic solvent such as ethyl acetate, butyl acetate, methyl lactate, ethyl lactate, and γ-butyrolactone; a polyhydric alcohol alkyl ether-based organic solvent such as ethylene glycol monoethyl ether, ethylene glycol monobutyl ether, ethylene glycol dimethyl ether, ethylene glycol diethyl ether, propylene glycol monomethyl ether, propylene glycol dimethyl ether, diethylene glycol monomethyl ether, diethylene glycol monobutyl ether, and diethylene glycol dimethyl ether; polyhydric alcohol alkyl ether acetate such as ethylene glycol monomethyl ether acetate, propylene glycol monomethyl ether acetate, and diethylene glycol monomethyl ether acetate; an amide-based organic solvent such as N,N-dimethyl formamide, N,N-dimethyl acetoamide, and N-methyl pyrrolidone, and the like are exemplified as a solvent used in the solution polymerization. Only one type or two or more types of such organic solvents can be used in combination.

A concentration of a (meth)acrylic monomer mixture at the time of initiating the solution polymerization is preferably 40 mass % to 70 mass %, and is more preferably 50 mass % to 60 mass %. In a case where the concentration of the (meth)acrylic monomer mixture is greater than or equal to 40 mass %, the molecular weight easily increases.

It is preferable that a glass transition temperature of the (meth)acrylic copolymer (A) having a not unevenly distributed reactive functional group is −50° C. to 50° C. In a case where the glass transition temperature is higher than or equal to −50° C., it is not possible to increase fluidity and pressure-sensitive adhesiveness of the resin composition for temporary fixing, and thus, it is possible to make handleability and peeling properties of the film-like temporary fixing material to be formed excellent, and in a case where the glass transition temperature is lower than or equal to 50° C., it is possible to ensure fluidity and pressure-sensitive adhesiveness of the resin composition for temporary fixing, and thus, it is possible to make low temperature pasting properties of the film-like temporary fixing material to be formed and embedding properties in a case where there is a projection such as a bump on a front surface of the workpiece excellent. From the same viewpoint, the glass transition temperature of the (meth)acrylic copolymer (A) having a not unevenly distributed reactive functional group is more preferably −40° C. to 40° C., and is even more preferably −30° C. to 30° C.

The glass transition temperature of the (meth)acrylic copolymer (A) having a not unevenly distributed reactive functional group is a midpoint glass transition temperature measured by using DSC. Specifically, the glass transition temperature is a midpoint glass transition temperature obtained by measuring a change in a heat amount in a condition of a temperature increasing rate of 10° C./minute, a measurement temperature of −80° C. to 80° C., and by being calculated by a method based on JIS K 7121.

It is preferable that a weight average molecular weight of the (meth)acrylic copolymer (A) having a not unevenly distributed reactive functional group is 100,000 to 3,000,000. In a case where the weight average molecular weight is greater than or equal to 100,000, it is possible to make heat resistance and peeling properties of the film-like temporary fixing material formed of the resin composition for temporary fixing excellent, and in a case where the weight average molecular weight is less than or equal to 3,000,000, it is possible to ensure fluidity of the resin composition for temporary fixing, and to make embedding properties in a case where there is a projection such as a bump on the front surface of the workpiece, excellent. From the same viewpoint, the weight average molecular weight of the (meth)acrylic copolymer (A) having a not unevenly distributed reactive functional group is more preferably 150,000 to 2,000,000, and is even more preferably 200,000 to 1,000,000. Furthermore, the weight average molecular weight is a value in terms of polystyrene using a calibration curve according to standard polystyrene in gel permeation chromatography (GPC).

In a case where the reactive functional group of the (meth)acrylic copolymer (A) having a not unevenly distributed reactive functional group is an epoxy group, as necessary, a resin composition for temporary fixing according to this embodiment is capable of containing a epoxy curing agent (B).

The epoxy curing agent (B) used in this embodiment may be an epoxy curing agent obtained by a reaction with respect to an epoxy group of a component (A), and for example, a phenolic curing agent, an acid anhydride-based curing agent, an amine-based curing agent, an imidazole-based curing agent, an imidazoline-based curing agent, a triazine-based curing agent, a phosphine-based curing agent, and the like are exemplified as the epoxy curing agent (B). Among them, the imidazole-based curing agent which can be expected to reduce processing time and to improve workability, is preferable, from the viewpoint of rapid-curing properties, heat resistance, and peeling properties. Only one type or two or more types of such compounds can be used in combination.

For example, 2-methyl imidazole, 2-undecyl imidazole, 2-heptadecyl imidazole, 1,2-dimethyl imidazole, 2-ethyl-4-methyl imidazole, 2-phenyl imidazole, 2-phenyl-4-methyl imidazole, 1-benzyl-2-methyl imidazole, 1-benzyl-2-phenyl imidazole, 1-cyanoethyl-2-methyl imidazole, 1-cyanoethyl-2-undecyl imidazole, 1-cyanoethyl-2-ethyl-4-methyl imidazole, 1-cyanoethyl-2-phenyl imidazole, 1-cyanoethyl-2-undecyl imidazolium trimellitate, 1-cyanoethyl-2-phenyl imidazolium trimellitate, 2,4-diamino-6-[2'-methyl imidazolyl-(1')]ethyl-s-triazine, 2,4-diamino-6-[2'-undecyl imidazolyl-(1')]-ethyl-s-triazine, 2,4-diamino-6-[2'-ethyl-4'-methyl imidazolyl-(1')]-ethyl-s-triazine, a 2,4-diamino-6-[2'-methyl imidazolyl-(1')]-ethyl-s-triazine isoisocyanuric acid adduct, a 2-phenyl imidazole isoisocyanuric acid adduct, 2-phenyl-4,5-dihydroxy methyl imidazole, 2-phenyl-4-methyl-5-hydroxy methyl imidazole, 2,3-dihydro-1H-pyrrolo[1,2-a]benzimidazole, and 1-dodecyl-2-methyl-3-benzyl imidazolium chloride are exemplified as the imidazole-based curing agent. Among them, 1-cyanoethyl-2-undecyl imidazole, 1-cyanoethyl-2-phenyl imidazole, 2,4-diamino-6-[2'-methyl imidazolyl-(1')]ethyl-s-triazine, 2,4-diamino-6-[2'-undecyl imidazolyl-(1')]-ethyl-s-triazine, 2,4-diamino-6-[2'-ethyl-4'-methyl imidazolyl-(1')]-ethyl-s-triazine, 2,4-diamino-6-[2'-ethyl-4'-methyl imidazolyl-(1')]-ethyl-s-triazine, the 2,4-diamino-6-[2'-methyl imidazolyl-(1')]-ethyl-s-triazine isoisocyanuric acid adduct, 2-phenyl-4,5-dihydroxy methyl imidazole, and 2-phenyl-4-methyl-5-hydroxy methyl imidazole are preferable, from the viewpoint of preservation stability of the resin composition for temporary fixing. Only one type or two or more types of such compounds can be used in combination.

It is preferable that a compounding amount of the epoxy curing agent (B) in the resin composition for temporary fixing according to this embodiment is 0.01 parts by mass to 50 parts by mass, with respect to 100 parts by mass of the (meth)acrylic copolymer (A) having a not unevenly distributed reactive functional group. In a case where the compounding amount is greater than or equal to 0.01 parts by mass, it is possible to make curing properties and heat resistance of the film-like temporary fixing material formed of the resin composition for temporary fixing excellent, and thus, it is possible to expect to reduce a processing time and to improve workability, and in a case where the compounding amount is less than or equal to 50 parts by mass, it is possible to make preservation stability of the resin composition for temporary fixing excellent. From the same viewpoint, the content of the epoxy curing agent (B) is more preferably 0.05 parts by mass to 30 parts by mass, and is particularly preferably 0.1 parts by mass to 10 parts by mass, with respect to 100 parts by mass of the (meth)acrylic copolymer (A) having a not unevenly distributed reactive functional group.

The resin composition for temporary fixing according to this embodiment is capable of containing a silicone compound (C) and the other components, as necessary, in addition to the (meth)acrylic copolymer (A) having a not unevenly distributed reactive functional group.

The resin composition for temporary fixing according to this embodiment contains the silicone compound (C), and thus, when the film-like temporary fixing material to be formed is peeled off from the semiconductor wafer or the support body, it is possible to easily peel off the film-like temporary fixing material without using a solvent at a low temperature of lower than or equal to 100° C.

The silicone compound (C) may be a compound including a siloxane portion, and for example, organopolysiloxane not having a reactive functional group, organopolysiloxane having a reactive functional group, a silicone modified polyimide resin, a silicone modified polyamide imide resin, a silicone modified alkyd resin, straight silicone oil, non-reactive modified silicone oil, reactive modified silicone oil, and the like are exemplified as the silicone compound (C). Among them, the silicone modified alkyd resin is preferable, from the viewpoint of heat resistance, peeling properties, and compatibility with respect to the (meth)acrylic copolymer (A) having a not unevenly distributed reactive functional group of the film-like temporary fixing material formed of the resin composition for temporary fixing. Only one type or two or more types of such compounds can be used in combination.

For example, a silicone modified alkyd resin obtained by allowing organopolysiloxane having a hydroxyl group to react as an alcohol component at the same time when polyhydric alcohol, an aliphatic acid, a polybasic acid, or the like reacts, a silicone modified alkyd resin obtained by allowing organopolysiloxane having a reactive functional group to react with a general alkyd resin synthesized in advance, and the like are exemplified as the silicone modified alkyd resin.

For example, dihydric alcohol such as ethylene glycol, diethylene glycol, triethylene glycol, propylene glycol, trimethylene glycol, tetramethylene glycol, and neopentyl glycol, trihydric alcohol such as glycerin, trimethylol ethane, and trimethylol propane, and tetrahydric or more polyhydric alcohol such as diglycerin, triglycerin, pentaerythritol, dipentaerythritol, mannitol, and sorbit are exemplified as polyhydric alcohol used as a raw material of the alkyd resin. Only one type of such components may be independently used, and two or more types thereof may be used in combination.

For example, an aromatic polybasic acid such as a phthalic anhydride, a terephthalic acid, an isophthalic acid, and a trimellitic anhydride, an aliphatic saturated polybasic acid such as a succinic acid, an adipic acid, and a sebacic acid, an aliphatic unsaturated polybasic acid such as a maleic acid, a maleic anhydride, a fumaric acid, an itaconic acid, and a citraconic anhydride, a polybasic acid according to a Diels-Alder reaction, such as a cyclopentadiene-maleic anhydride adduct, a terpene-maleic anhydride adduct, and a rosin-maleic anhydride adduct, and the like are exemplified as a polybasic acid used as a raw material of the alkyd resin.

Only one type of such components may be independently used, and two or more types thereof may be used in combination.

The alkyd resin may further contain a modifier or a cross-linking agent.

For example, an octyl acid, a lauric acid, a palmitic acid, a stearic acid, an oleic acid, a linoleic acid, a linolenic acid, an eleostearic acid, a ricinoleic acid, a dehydrated ricinoleic acid, or coconut oil, linseed oil, tung oil, castor oil, dehydrated castor oil, soybean oil, safflower oil, and aliphatic acids thereof, and the like can be used as the modifier. Only one type of such components may be independently used, and two or more types thereof may be used in combination.

In a case where the resin composition for temporary fixing according to this embodiment contains the silicone modified alkyd resin, it is preferable to further contain a cross-linking agent capable of thermal cross-linking the silicone modified alkyd resin, or a cross-linking agent and a catalyst. An amino resin such as a melamine resin and a urea resin is exemplified as such a cross-linking agent. In this case, it is possible to further improve the heat resistance and the peeling properties of the film-like temporary fixing material formed of the resin composition for temporary fixing.

An amino resin such as a melamine resin and a urea resin, an urethane resin, an epoxy resin, and a phenolic resin can be exemplified as the cross-linking agent. Among them, it is preferable to use the amino resin, since an aminoalkyd resin which is cross-linked by the amino resin, is obtained. For example, TESFINE 319 and TA31-209E (all are manufactured by Hitachi Kasei Polymer Co., Ltd., Product Name, TESFINE: Registered Trademark) is exemplified as such a silicone modified alkyd resin. Only one type of such cross-linking agents may be independently used, and two or more types thereof may be used in combination.

In the silicone modified alkyd resin, an acidic catalyst can be used as a curing catalyst. The acidic catalyst is not particularly limited, and any acidic catalyst can be suitably selected from known acidic catalysts and can be used as a cross-linking reaction catalyst of the alkyd resin. For example, an organic-based acidic catalyst such as a p-toluene sulfonic acid and a methane sulfonic acid is preferable as such an acidic catalyst. Only one type of such acidic catalysts may be independently used, and two or more types thereof may be used in combination. In addition, a compounding amount of the acidic catalyst is selected in a range of generally 0.1 parts by mass to 40 parts by mass, preferably 0.5 parts by mass to 30 parts by mass, and more preferably 1 part by mass to 20 parts by mass, with respect to 100 parts by mass of the total amount of the alkyd resin and the cross-linking agent.

It is preferable that surface free energy of the silicone modified alkyd resin is 15 mN/m to 30 mN/m. When the surface free energy of the silicone modified alkyd resin is in such a range, it is possible to make heat resistance and peeling properties of the film-like temporary fixing material formed of the resin composition for temporary fixing compatible. Further, it is more preferable that the resin composition for temporary fixing contains a silicone modified alkyd resin of which surface free energy is 15 mN/m to 27 mN/m, and it is even more preferable that the resin composition for temporary fixing contains a silicone modified alkyd resin of which surface free energy is 15 mN/m to 24 mN/m, from the viewpoint of heat resistance. Furthermore, a silicone modified alkyd resin is applied onto a PET film, and then, a contact angle of water, ethylene glycol, and methyl iodide is measured by using a contact angle meter (CA-X type, manufactured by Kyowa Interface Science Co., LTD.), with respect to a film having a thickness of 0.3 µm, which is obtained by drying the silicone modified alkyd resin at 150° C. for 3 seconds, and thus, surface free energy can be calculated by surface free energy analysis software (EG-2, manufactured by Kyowa Interface Science Co., LTD.).

It is preferable that a compounding amount of the silicone compound (C) is 0.1 parts by mass to 100 parts by mass, with respect to 100 parts by mass of the (meth)acrylic copolymer (A) having a not unevenly distributed reactive functional group. In a case where the compounding amount is greater than or equal to 0.1 parts by mass, it is possible to make peeling properties of the film-like temporary fixing material formed of the resin composition for temporary fixing excellent, and in a case where the compounding amount is less than or equal to 100 parts by mass, it is possible to rigidly fix the semiconductor wafer onto the support body, and to suppress peeling at the time of grinding or the like the semiconductor wafer. From the same viewpoint, the compounding amount of the silicone compound (C) is more preferably 0.5 parts by mass to 90 parts by mass, and is particularly preferably 1 part by mass to 80 parts by mass, with respect to 100 parts by mass of the (meth)acrylic copolymer (A) having a not unevenly distributed reactive functional group.

The resin composition for temporary fixing according to this embodiment is capable of further containing a thermosetting component such as an epoxy resin, from the viewpoint of improving heat resistance.

The epoxy resin is not particularly limited insofar as having a heat resistance effect by curing. A difunctional epoxy resin such as bisphenol A type epoxy, a novolac type epoxy resin such as a phenol novolac type epoxy resin and a cresol novolac type epoxy resin can be used as the epoxy resin. In addition, generally known epoxy resin such as a polyfunctional epoxy resin, a glycidyl amine type epoxy resin, a heterocyclic contain epoxy resin, an alicyclic epoxy resin can be applied as the epoxy resin. Only one type or two or more types of such epoxy resins can be used in combination.

It is preferable that a compounding amount of the thermosetting component (for example, the epoxy resin) is 1 part by mass to 100 parts by mass, with respect to 100 parts by mass of the (meth)acrylic copolymer (A) having a not unevenly distributed reactive functional group. In a case where the compounding amount is greater than or equal to 1 part by mass, it is possible to make heat resistance of the film-like temporary fixing material formed of the resin composition for temporary fixing excellent, and in a case where the compounding amount is less than or equal to 100 parts by mass, it is possible to ensure fluidity of the film-like temporary fixing material formed of the resin composition for temporary fixing, and thus, it is possible to make embedding properties in a case where there is a projection such as a bump on the front surface of the workpiece excellent. From the same viewpoint, the compounding amount of the thermosetting component (for example, the epoxy resin) is more preferably 2 parts by mass to 80 parts by mass, and particularly preferably 3 parts by mass to 60 parts by mass, with respect to 100 parts by mass of the (meth)acrylic copolymer (A) having a not unevenly distributed reactive functional group.

The resin composition for temporary fixing according to this embodiment is capable of further containing an inorganic filler, from the viewpoint of improving heat resistance.

For example, insulating fine particles, whisker, and the like are exemplified as the inorganic filler. For example, glass, silica, alumina, titanium oxide, carbon black, mica, and boron nitride are exemplified as the insulating fine particles. Among them, silica, alumina, titanium oxide, and boron nitride are preferable, and silica, alumina, and boron nitride are more preferable, from the viewpoint of handleability. For example, aluminum borate, aluminum titanate, zinc oxide, calcium silicate, magnesium sulfate, and boron nitride are exemplified as the whisker. Only one type or two or more types of such compounds can be used in combination.

It is preferable that the inorganic filler has an organic group on a front surface. The front surface of the inorganic filler is modified by the organic group, and thus, it is easy to improve dispersibility with respect to an organic solvent at the time of preparing the resin composition for temporary fixing, and adhesion properties and heat resistance of the film-like temporary fixing material formed of the resin composition for temporary fixing.

It is preferable that an average particle diameter of the inorganic filler is 0.01 µm to 10 µm. In a case where the average particle diameter is greater than or equal to 0.01 µm, it is possible to ensure fluidity of the film-like temporary fixing material formed of the resin composition for temporary fixing, and thus, it is possible to make embedding properties in a case where there is a projection such as a bump on the front surface of the workpiece excellent, and in a case where the average particle diameter is less than or equal to 10 µm, it is possible to prevent the inorganic filler from being precipitated in the resin composition for temporary fixing. From the same viewpoint, the average particle diameter of the inorganic filler is more preferably 0.05 µm to 5 µm, and is particularly preferably 0.1 µm to 3 µm.

It is preferable that a compounding amount of the inorganic filler is 1 part by mass to 100 parts by mass, with respect to 100 parts by mass of the (meth)acrylic copolymer (A) having a not unevenly distributed reactive functional group. In a case where the compounding amount is greater than or equal to 1 part by mass, it is possible to make heat resistance of the film-like temporary fixing material formed of the resin composition for temporary fixing excellent, and in a case where the compounding amount is less than or equal to 100 parts by mass, it is possible to ensure fluidity of the film-like temporary fixing material formed of the resin composition for temporary fixing, and thus, it is possible to make embedding properties in a case where there is a projection such as a bump on the front surface of the workpiece excellent. From the same viewpoint, the compounding amount of the inorganic filler is more preferably 3 parts by mass to 70 parts by mass, and is particularly preferably 5 parts by mass to 50 parts by mass, with respect to 100 parts by mass of the (meth)acrylic copolymer (A) having a not unevenly distributed reactive functional group.

An organic filler can be further compounded in the resin composition for temporary fixing according to this embodiment. For example, carbon, a rubber-based filler, silicone-based fine particles, polyamide fine particles, polyimide fine particles, and the like are exemplified as the organic filler. A compounding amount of the organic filler is preferably less than or equal to 50 parts by mass, is more preferably less than or equal to 40 parts by mass, and is even more preferably less than or equal to 30 parts by mass, with respect to 100 parts by mass of the (meth)acrylic copolymer (A) having a not unevenly distributed reactive functional group.

A so-called additive such as an antioxidant, an anti-yellowing agent, a coloring agent, a plasticizer, and a stabilizer, may be further added to the resin composition for temporary fixing according to this embodiment, at a ratio not negatively affecting the effect of the present invention, as necessary.

The resin composition for temporary fixing of this embodiment may be diluted by further using an organic solvent, as necessary. The organic solvent is not particularly limited insofar as being capable of dissolving the resin composition, and for example, a ketone-based organic solvent such as acetone, methyl ethyl ketone, methyl isobutyl ketone, and cyclohexanone; an ester-based organic solvent such as ethyl acetate, butyl acetate, methyl lactate, ethyl lactate, and γ-butyrolactone; a polyhydric alcohol alkyl ether-based organic solvent such as ethylene glycol monoethyl ether, ethylene glycol monobutyl ether, ethylene glycol dimethyl ether, ethylene glycol diethyl ether, propylene glycol monomethyl ether, propylene glycol dimethyl ether, diethylene glycol monomethyl ether, diethylene glycol monobutyl ether, and diethylene glycol dimethyl ether; polyhydric alcohol alkyl ether acetate such as ethylene glycol monomethyl ether acetate, propylene glycol monomethyl ether acetate, and diethylene glycol monomethyl ether acetate; and an amide-based organic solvent such as N,N-dimethyl formamide, N,N-dimethyl acetoamide, and N-methyl pyrrolidone are exemplified as the organic solvent. Only one type or two or more types of such organic solvents can be used in combination.

It is preferable that a solid content concentration of the resin composition for temporary fixing according to this embodiment is 10 mass % to 80 mass %.

The resin composition for temporary fixing of this embodiment can be prepared by mixing and kneading the (meth)acrylic copolymer (A) having a not unevenly distributed reactive functional group, and as necessary, the epoxy curing agent (B), the silicone compound (C), the organic solvent, and the other components. The mixing and kneading can be performed by suitably combining general dispersers such as a stirrer, a stone mill, a three-roll mill, and a bead mill.

As another embodiment of the resin composition for temporary fixing, instead of the component (A) in the resin composition for temporary fixing described above, (i) a (meth)acrylic copolymer (i) obtained by performing living radical polymerization with respect to a polymerizable composition containing the (meth)acrylic monomer (a-1) in which the glass transition temperature of the homopolymer is higher than or equal to 50° C., the (meth)acrylic monomer (a-2) in which the glass transition temperature of the homopolymer is less than or equal to 0° C., and the (meth)acrylic monomer (a-3) having the reactive functional group (also referred to as an component (i)), or (ii) a (meth)acrylic copolymer (ii) obtained by performing polymerization while adding the (meth)acrylic monomer (a-3) having the reactive functional group into a polymerizable composition containing the (meth)acrylic monomer (a-1) in which the glass transition temperature of the homopolymer is higher than or equal to 50° C. and the (meth)acrylic monomer (a-2) in which the glass transition temperature of the homopolymer is less than or equal to 0° C. (also referred to as a component (ii)).

The monomers of (a-1), (a-2), and (a-3) described above, and polymerization methods, compounding amounts, and the like thereof can be identical to those of the component (A) described above. In addition, glass transition temperatures and weight average molecular weights of the component (i) and the component (ii) may be in a preferred range of the component (A) described above.

[Resin Film for Temporary Fixing]

The resin film for temporary fixing according to this embodiment is configured by forming the resin composition for temporary fixing according to this embodiment into the shape of a film.

The resin film for temporary fixing according to this embodiment, for example, can be easily manufactured by applying the resin composition for temporary fixing onto a support film. In addition, in a case where the resin composition for temporary fixing is diluted by the organic solvent, the resin composition is applied onto the support film, and the organic solvent is removed by heating and drying, and thus, the resin film for temporary fixing can be manufactured.

A protective film can be pasted onto the resin film for temporary fixing disposed on the support film, as necessary. In this case, it is possible to obtain a resin film sheet for temporary fixing having a three-layer structure formed of the support film, the resin film for temporary fixing, and the protective film, described below.

The resin film sheet for temporary fixing obtained as described above, for example, can be easily preserved by being wound into the shape of a roll. In addition, the roll-like film can be preserved by being cut into a preferable size to be in the shape of a sheet.

FIG. 4(A) is a top view illustrating one embodiment of the resin film sheet for temporary fixing of this embodiment, and FIG. 4(B) is a schematic sectional view along line I-I of FIG. 4(A).

Figure 4:
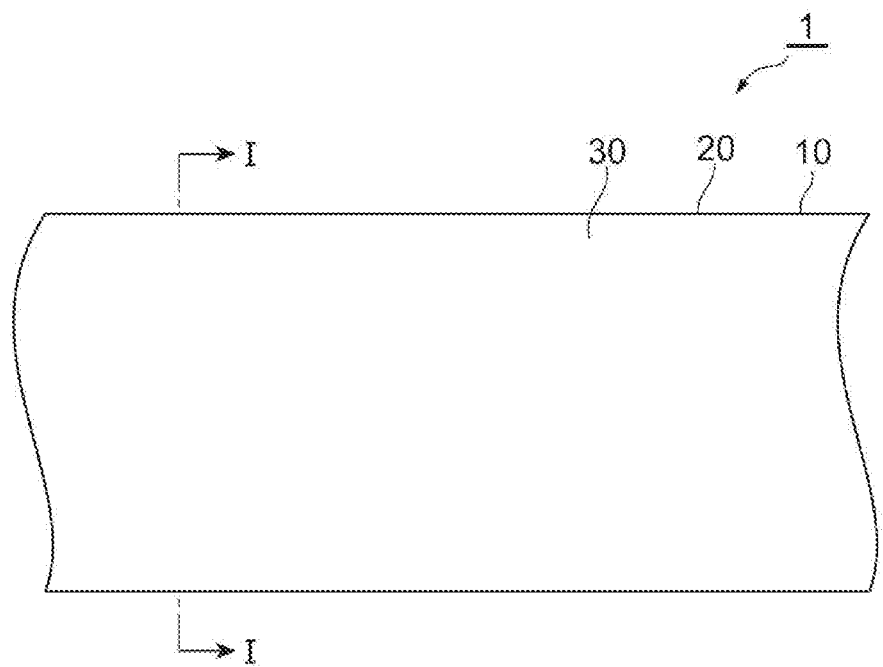
FIG. 4(A) is a top view illustrating one embodiment of a resin film sheet for temporary fixing.
FIG. 4(B) is a schematic sectional view along line I-I of FIG. 4(A).
Figure 4:
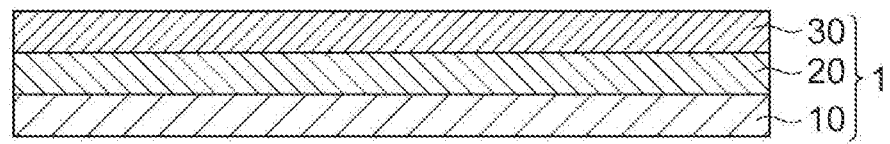

A resin film sheet 1 for temporary fixing illustrated in FIG. 4, includes a support film 10, the resin film 20 for temporary fixing, which is disposed on the support film 10, and a protective film 30 which is disposed on a side of the resin film 20 for temporary fixing, opposite to the support film 10.

The support film 10 is not particularly limited, and for example, polyethylene terephthalate, polybutylene terephthalate, polyethylene naphthalate, polyethylene, polypropylene, polyamide, polyimide, and the like are exemplified as the support film 10. Among them, polyethylene terephthalate, polybutylene terephthalate, polyethylene naphthalate, polypropylene, polyamide, and polyimide are preferable, from the viewpoint of flexibility and toughness. In addition, it is preferable that the support film 10 has releasability, and it is preferable that a film subjected to a release treatment by a silicone-based compound, a fluorine-based compound, and the like is used as the support film, from the viewpoint of improving peeling properties with respect to the resin film for temporary fixing (a resin layer).

The thickness of the support film 10 may be suitably changed according to desired flexibility, and is preferably 3 μm to 250 μm. In a case where the thickness is greater than or equal to 3 μm, a film strength is sufficient, and in a case where the thickness is less than or equal to 250 μm, sufficient flexibility is obtained. From such a viewpoint, the thickness of the support film 10 is more preferably 5 μm to 200 μm, and is particularly preferably 7 μm to 150 μm.

The thickness of the resin film 20 for temporary fixing of this embodiment is not particularly limited, but is preferably 5 μm to 300 μm, in the thickness after drying. In a case where the thickness is greater than or equal to 5 μm, the thickness is sufficient, and thus, a strength of a film or a cured material of the film is sufficient, and in a case where the thickness is less than or equal to 300 μm, it is easy to reduce the amount of remaining solvent in the film by sufficient drying, and thus, it is possible to reduce foam formation at the time of heating the cured material of the film.

In a case of manufacturing a thick film, a film having a thickness of less than or equal to 100 μm, which is formed in advance, may be pasted. By using the pasted film as described above, it is possible to reduce the remaining solvent at the time of preparing a thick film.

The protective film 30 is not particularly limited, and for example, polyethylene terephthalate, polybutylene terephthalate, polyethylene naphthalate, polyethylene, polypropylene, and the like are exemplified as the protective film 30. Among them, polyethylene terephthalate, polyethylene, and polypropylene are preferable, from the viewpoint of flexibility and toughness. In addition, it is preferable that the film subjected to the release treatment by the silicone-based compound, the fluorine-based compound, and the like, is used as the protective film, from the viewpoint of improving peeling properties with respect to the resin film for temporary fixing (the resin layer).

The thickness of the protective film 30 can be suitably set according to desired flexibility, and is preferably 10 μm to 250 μm. In a case where the thickness is greater than or equal to 10 μm, a film strength is sufficient, and in a case where the thickness is less than or equal to 250 μm, sufficient flexibility is obtained. From such a viewpoint, the thickness of the protective film 30 is more preferably 15 μm to 200 μm, and is particularly preferably 20 μm to 150 μm.

FIG. 5(A) is a top view illustrating another embodiment of the resin film sheet for temporary fixing according to the present invention, and FIG. 5(B) is a schematic sectional view along line II-II of FIG. 5(A).

Figure 5:
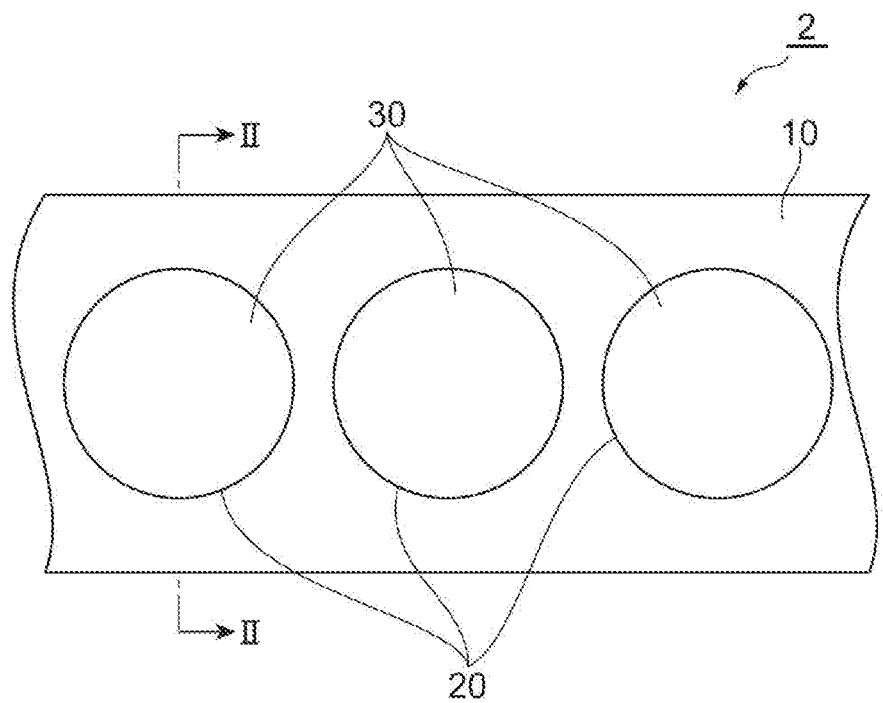
FIG. 5(A) is a top view illustrating another embodiment of the resin film sheet for temporary fixing.
FIG. 5(B) is a schematic sectional view along line II-II of FIG. 5(A).
Figure 5:
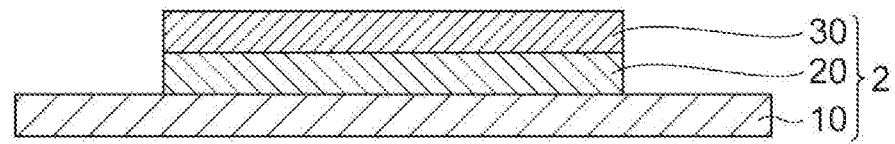

A resin film sheet 2 for temporary fixing illustrated in FIG. 5 has the same configuration as that of the resin film sheet 1 for temporary fixing, except that the resin film 20 for temporary fixing and the protective film 30 are cut in advance according to the shape of a member to be temporarily fixed. Furthermore, in FIG. 5, an outer edge portion of the cut resin film 20 for temporary fixing and the cut protective film 30 is removed, but a slit may be formed on the resin film for temporary fixing and the protective film according to the shape of the member to be temporarily fixed, and thus, the outer edge portion may remain.

In the present invention, the film-like temporary fixing material and the resin film for temporary fixing described above are capable of having a configuration of two or more layers. In this case, it is preferable that at least a layer in contact with the workpiece is capable of containing the component (A) described above, or the component (i) described above or the component (ii) described above, and formed of the resin composition for temporary fixing according to this embodiment. Accordingly, it is possible to have a difference in a peeling strength or an elastic modulus on each layer, and thus, it is possible to selectively peel off a peeling interface.

Figure 6:
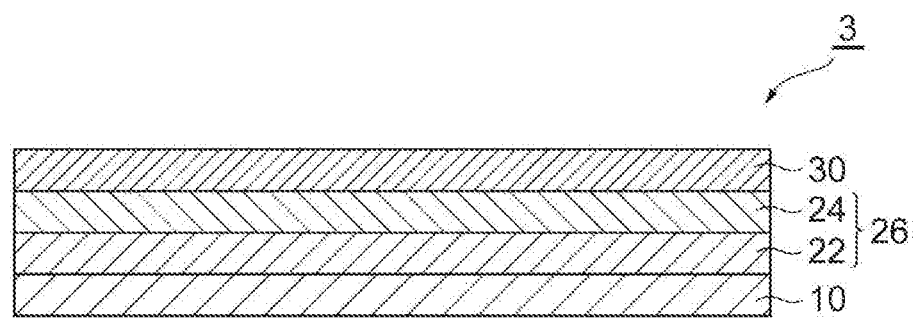
FIG. 6 is a schematic sectional view illustrating another embodiment of the resin film sheet for temporary fixing.

A resin film sheet 3 for temporary fixing illustrated in FIG. 6 includes the support film 10, a first thermoplastic resin layer 22 configured by forming the resin composition for temporary fixing of this embodiment into the shape of a film, which is disposed on the support film 10, and a second thermoplastic resin layer 24 disposed on the first thermoplastic resin layer 22. In the resin film sheet 3 for temporary fixing of this embodiment, a resin film 26 for temporary fixing is formed of the first thermoplastic resin layer 22 and the second thermoplastic resin layer 24, and the protective film 30 is disposed on the second thermoplastic resin layer 24.

The support film 10 and the protective film 30 described above can be used.

The first thermoplastic resin layer 22 can be formed by applying the resin composition for temporary fixing onto the support film 10. In addition, in a case where the resin composition for temporary fixing is diluted by the organic solvent, the resin composition is applied onto the support film, and the organic solvent is removed by heating and drying, and thus, the first thermoplastic resin layer 22 can be formed.

The thickness of the first thermoplastic resin layer 22 can be 10 μm to 350 μm.

The same material as that of the first thermoplastic resin layer 22 can be used as a material configuring the second thermoplastic resin layer 24, and for example, the (meth) acrylic copolymer, the epoxy curing agent, and the silicone compound, described above, are exemplified as the material. Further, as necessary, an epoxy resin, an inorganic filler, an organic filler, and various additives can be included as the material.

The second thermoplastic resin layer 24 can be formed by applying a coating liquid containing the material described above onto the first thermoplastic resin layer 22. In a case where the coating liquid is diluted by the organic solvent, the organic solvent can be removed by heating and drying.

In addition, the second thermoplastic resin layer formed on the support film or the protective film may be pasted onto the first thermoplastic resin layer.

The thickness of the second thermoplastic resin layer 24 can be 10 μm to 350 μm.

It is preferable that the resin film sheet 3 for temporary fixing of this embodiment is used such that the first thermoplastic resin layer 22 is in contact with the workpiece.

EXAMPLES

Hereinafter, the present invention will be described in more detail by examples and comparative examples, but the present invention is not limited to the following examples.

Synthesis Example 1

Synthesis of (Meth)Acrylic Copolymer A-1 Having Not Unevenly Distributed Reactive Functional Group 0.04 parts by mass of polyvinyl alcohol and 200 parts by mass of ion exchange water were added into a flask provided with a stirrer, a cooler, a gas introduction pipe, and a thermometer, and a mixture of 20 parts by mass of methyl methacrylate as (a-1), 65 parts by mass of butyl acrylate as (a-2), 15 parts by mass of glycidyl methacrylate as (a-3), 0.4 parts by mass of lauroyl peroxide, and 0.1 parts by mass of O-ethyl-S-(1-phenyl ethyl) dithiocarbonate as an RAFT agent was added while being stirred. A liquid temperature increased while introducing nitrogen gas, and polymerization was performed at 60° C. for 10 hours, and then, at 90° C. for 2 hours, and thus, resin particles were obtained. Such resin particles were filtered, and were washed with ion exchange water, and then, were dried at 40° C. for 8 hours by using a vacuum dryer, and thus, a (meth)acrylic copolymer A-1 having a not unevenly distributed epoxy group was obtained.

[Measurement of Weight Average Molecular Weight]

A weight average molecular weight of A-1 (in terms of standard polystyrene) was measured in a condition of an eluent flow rate of 1 mL/minute and a column temperature of 40° C., by using GPC (HLC-8320GPC, manufactured by Tosoh Corporation), and as a result thereof, the weight average molecular weight was $31 \times 10^4$. Furthermore, tetrahydrofuran was used as an eluent, and Gelpack GL-A150-S/GL-A160-S, manufactured by Hitachi Chemical Company, Ltd. was used as a column. The weight average molecular weight is a value in terms of polystyrene using a calibration curve according to standard polystyrene.

[Measurement of Glass Transition Temperature]

A glass transition temperature of A-1 was measured in a condition of a temperature increasing rate of 10° C./minute and a measurement temperature of −80 to 80° C., by using DSC (DSC8230, manufactured by Rigaku Corporation), and as a result thereof, the glass transition temperature was −14° C. Furthermore, in this case, the glass transition temperature is a midpoint glass transition temperature calculated by a method based on JIS K 7121 from a change in a heat amount.

Synthesis Example 2

Synthesis of (Meth)Acrylic Copolymer A-2 Having Not Unevenly Distributed Reactive Functional Group 0.04 parts by mass of polyvinyl alcohol and 200 parts by mass of ion exchange water were added into a flask provided with a stirrer, a cooler, a gas introduction pipe, and a thermometer, and a mixture of 20 parts by mass of methyl methacrylate as (a-1), 65 parts by mass of butyl acrylate as (a-2), 0.4 parts by mass of lauroyl peroxide, and 0.075 parts by mass of n-octyl mercaptan was added while being stirred. A liquid temperature increased to 60° C. while introducing nitrogen gas, and 15 parts by mass of glycidyl methacrylate as (a-3) was continuously dropped for 4 hours. After that, polymerization was performed at 60° C. for 2 hours, and then, at 90° C. for 2 hours, and thus, resin particles were obtained. Such resin particles were filtered, and were washed with ion exchange water, and then, were dried at 40° C. for 8 hours by using a vacuum dryer, and thus, a (meth)acrylic copolymer A-2 having a not unevenly distributed epoxy group was obtained. A weight average molecular weight and a glass transition temperature of A-2 were measured by the same method as that of Synthesis Example 1, and as a result thereof, the weight average molecular weight and the glass transition temperature were $30 \times 10^4$ and −13° C., respectively.

Synthesis Example 3

Synthesis of (Meth)Acrylic Copolymer A-3 Having Not Unevenly Distributed Reactive Functional Group 0.04 parts by mass of polyvinyl alcohol and 200 parts by mass of ion exchange water were added into a flask provided with a stirrer, a cooler, a gas introduction pipe, and a thermometer, and a mixture of 21 parts by mass of methyl methacrylate as (a-1), 64 parts by mass of 2-ethyl hexyl acrylate as (a-2), 15 parts by mass of glycidyl methacrylate as (a-3), 0.4 parts by mass of lauroyl peroxide, and 0.06 parts by mass of O-ethyl-S-(1-phenyl ethyl) dithiocarbonate as an RAFT agent was added while being stirred. A liquid temperature increased while introducing nitrogen gas, and polymerization was performed at 60° C. for 10 hours, and then, at 90° C. for 2 hours, and thus, resin particles were obtained. Such resin particles were filtered, and were washed with ion exchange water, and then, were dried at 40° C. for 8 hours by using a vacuum dryer, and thus, a (meth)acrylic copolymer A-3 was obtained. A weight average molecular weight and a glass transition temperature of A-3 were measured by the same method as that of Synthesis Example 1, and as a result thereof, the weight average molecular weight and the glass transition temperature were $47 \times 10^4$ and −11° C., respectively.

Synthesis Example 4

Synthesis of (Meth)Acrylic Copolymer A-4 Having Not Unevenly Distributed Reactive Functional Group 0.04 parts by mass of polyvinyl alcohol and 200 parts by mass of ion exchange water were added into a flask provided with a stirrer, a cooler, a gas introduction pipe, and a thermometer, and a mixture of 21 parts by mass of methyl methacrylate as (a-1), 64 parts by mass of 2-ethyl hexyl acrylate as (a-2), 0.4 parts by mass of lauroyl peroxide, and 0.045 parts by mass of n-octyl mercaptan was added while being stirred. A liquid temperature increased to 60° C. while introducing nitrogen gas, and 15 parts by mass of glycidyl methacrylate as (a-3) was continuously dropped for 4 hours. After that, polymerization was performed at 60° C. for 2 hours, and then, at 90° C. for 2 hours, and thus, resin particles were obtained. Such resin particles were filtered, and were washed with ion exchange water, and then, were dried at 40° C. for 8 hours by using a vacuum dryer, and thus, a (meth)acrylic copolymer A-4 having a not unevenly distributed epoxy group was obtained. A weight average molecular weight and a glass transition temperature of A-4 were measured by the same method as that of Synthesis Example 1, and as a result thereof, the weight average molecular weight and the glass transition temperature were $45 \times 10^4$ and −12° C., respectively.

Synthesis Example 5

Synthesis of (Meth)Acrylic Copolymer A-5 Having Not Unevenly Distributed Reactive Functional Group 0.04 parts by mass of polyvinyl alcohol and 200 parts by mass of ion exchange water were added into a flask provided with a stirrer, a cooler, a gas introduction pipe, and a thermometer, and a mixture of 18 parts by mass of methyl methacrylate as (a-1), 67 parts by mass of isooctyl acrylate as (a-2), 0.4 parts by mass of lauroyl peroxide, and 0.045 parts by mass of n-octyl mercaptan was added while being stirred. A liquid temperature increased to 60° C. while introducing nitrogen gas, and 15 parts by mass of glycidyl methacrylate as (a-3) was continuously dropped for 4 hours. After that, polymerization was performed at 60° C. for 2 hours, and then, at 90° C. for 2 hours, and thus, resin particles were obtained. Such resin particles were filtered, and were washed with ion exchange water, and then, were dried at 40° C. for 8 hours by using a vacuum dryer, and thus, a (meth)acrylic copolymer A-5 having a not unevenly distributed epoxy group was obtained. A weight average molecular weight and a glass transition temperature of A-5 were measured by the same method as that of Synthesis Example 1, and as a result thereof, the weight average molecular weight and the glass transition temperature were $47 \times 10^4$ and −16° C., respectively.

Synthesis Example 6

Synthesis of (Meth)Acrylic Copolymer C-1 Not Having Reactive Functional Group 0.04 parts by mass of polyvinyl alcohol and 200 parts by mass of ion exchange water were added into a flask provided with a stirrer, a cooler, a gas introduction pipe, and a thermometer, and a mixture of 32 parts by mass of methyl methacrylate as (a-1), 68 parts by mass of butyl acrylate as (a-2), 0.4 parts by mass of lauroyl peroxide, and 0.06 parts by mass of n-octyl mercaptan was added while being stirred. A liquid temperature increased while introducing nitrogen gas, and polymerization was performed at 60° C. for 6 hours, and then, at 90° C. for 2 hours, and thus, resin particles were obtained. Such resin particles were filtered, and were washed with ion exchange water, and then, were dried at 40° C. for 8 hours by using a vacuum dryer, and thus, a (meth)acrylic copolymer C-1 not having a reactive functional group was obtained. A weight average molecular weight and a glass transition temperature of C-1 were measured by the same method as that of Synthesis Example 1, and as a result thereof, the weight average molecular weight and the glass transition temperature were $42\times10^4$ and $-13°$ C., respectively.

Synthesis Example 7

Synthesis of (Meth)Acrylic Copolymer C-2 Having Unevenly Distributed Reactive Functional Group 0.04 parts by mass of polyvinyl alcohol and 200 parts by mass of ion exchange water were added into a flask provided with a stirrer, a cooler, a gas introduction pipe, and a thermometer, and a mixture of 20 parts by mass of methyl methacrylate as (a-1), 65 parts by mass of butyl acrylate as (a-2), 15 parts by mass of glycidyl methacrylate as (a-3), 0.4 parts by mass of lauroyl peroxide, and 0.075 parts by mass of n-octyl mercaptan was added while being stirred. A liquid temperature increased while introducing nitrogen gas, and polymerization was performed at 60° C. for 6 hours, and then, at 90° C. for 2 hours, and thus, resin particles were obtained. Such resin particles were filtered, and were washed with ion exchange water, and then, were dried at 40° C. for 8 hours by using a vacuum dryer, and thus, a (meth)acrylic copolymer C-2 having an unevenly distributed epoxy group was obtained. A weight average molecular weight and a glass transition temperature of C-2 were measured by the same method as that of Synthesis Example 1, and as a result thereof, the weight average molecular weight and the glass transition temperature were $33\times10^4$ and $-9°$ C., respectively.

Examples 1 to 5 and Comparative Examples 1 and 2

Preparation of Varnish (Resin Composition for Temporary Fixing)

The (meth)acrylic copolymer, the epoxy curing agent (B), the silicone compound (C), and an organic solvent were compounded according to a compounding ratio shown in Table 1, and thus, varnishes V-1 to V-7 were prepared.

[Preparation of Resin Film for Temporary Fixing]

The varnishes V-1 to V-7 prepared at the compounding ratio shown in Table 1, were applied onto a release treatment surface of a release PET film (A31, manufactured by Teijin Dupont Films Limited, a thickness of 38 μm), was dried at 90° C. for 5 minutes and at 140° C. for 5 minutes, and thus, resin films F-1 to F-7 for temporary fixing were obtained. At this time, the thickness of the resin layer can be arbitrarily adjusted, and in this example, a film thickness after drying was adjusted to be 40 μm.

TABLE 1

| Item | | Unit | Example 1 | Example 2 | Example 3 | Example 4 | Example 5 | Comparative Example 1 | Comparative Example 2 |
|---|---|---|---|---|---|---|---|---|---|
| Varnish | | — | V-1 | V-2 | V-3 | V-4 | V-5 | V-6 | V-7 |
| (Meth)Acrylic Copolymer | A-1 | Parts by Mass | 100 | — | — | — | — | — | — |
| | A-2 | | — | 100 | — | — | — | — | — |
| | A-3 | | — | — | 100 | — | — | — | — |
| | A-4 | | — | — | — | 100 | — | — | — |
| | A-5 | | — | — | — | — | 100 | — | — |
| | C-1 | | — | — | — | — | — | 100 | — |
| | C-2 | | — | — | — | — | — | — | 100 |
| (B) Epoxy Curing Agent | 2PZ-CN | Parts by Mass | 1 | 1 | 1 | 1 | 1 | 1 | 1 |
| (C) Silicone Compound | TA31-209E | Parts by Mass | 22.2 (solid content 10) | 22.2 (solid content 10) | 11.1 (solid content 5) | 11.1 (solid content 5) | 11.1 (solid content 5) | 11.1 (solid content 5) | 22.2 (solid content 10) |
| | SH550 | | 3 | 3 | 2 | 2 | 2 | 2 | 3 |
| | SH3773M | | 5 | 5 | 3 | 3 | 3 | 3 | 5 |
| Organic Solvent | Cyclohexanone | Parts by Mass | 300 | 300 | 300 | 300 | 350 | 300 | 300 |
| Resin Film for Temporary Fixing Material | | — | F-1 | F-2 | F-3 | F-4 | F-5 | F-6 | F-7 |

The details of each component in Table 1 are as follows.

2PZ-CN: Imidazole-Based Epoxy Curing Agent (manufactured by SHIKOKU CHEMICALS CORPORATION)

TA31-209E: Silicone Modified Alkyd Resin (manufactured by Hitachi Kasei Polymer Co., Ltd.)

SH550: Phenyl Modified Silicone Oil (manufactured by Toray Dow Corning Corporation)

SH3773M: Polyether Modified Silicone Oil (manufactured by Toray Dow Corning Corporation)

Various evaluations of the resin films for temporary fixing obtained as described above were performed in the following procedure. Evaluation results are shown in Table 2.

[Evaluation of Low Temperature Pasting Properties]

The resin film for temporary fixing was laminated on an element formation surface of a semiconductor wafer, in a condition of an atmospheric pressure of less than or equal to 1 hPa, a crimping temperature of 120° C., a lamination pressure of 0.1 MPa, and retaining time of 15 seconds, by using a vacuum laminator (a vacuum laminator LM-50×50-S, manufactured by NPC Incorporated). After that, a support film (A31) was removed, and thus, a semiconductor wafer with the resin film for temporary fixing was obtained. A sample in which air bubbles or the like due to insufficient embedding did not occur on the element formation surface of the semiconductor wafer after lamination, was evaluated as "A", and a sample in which air bubbles or the like occurred, was evaluated as "C".

[Crimping with Respect to Support Body]

The semiconductor wafer with the resin film for temporary fixing described above and a support body (a silicon wafer) were crimped, in a condition of an atmospheric pressure of less than or equal to 1 hPa, a crimping temperature of 120° C., a lamination pressure of 0.1 MPa, and retaining time of 15 seconds, by using a vacuum laminator (a vacuum laminator LM-50×50-S, manufactured by NPC Incorporated), and thus, a lamination sample was obtained in which the semiconductor wafer described above was temporarily fixed onto the support body via the resin film for temporary fixing. After that, heating was performed at 110° C. for 30 minutes, and then, at 170° C. for 1 hour, and thermal curing of the resin film for temporary fixing was performed.

[Evaluation of Back Grinding Properties]

In the lamination sample, a surface of the semiconductor wafer on a side opposite to a side in contact with the resin film for temporary fixing was ground by using a full automatic grinder/polisher (DGP-8761, manufactured by DISCO Inc.). In a wheel, a first axis of GF01-SDC320-BT300-50, a second axis of IF-01-1-4/6-B•K09, and a third axis of DPEG-GA0001 were respectively used. The number of rotations of a chuck table was 300 min$^{-1}$, the number of rotations of the wheel was set such that the first axis of 3,200 min$^{-1}$, the second axis of 3,400 min$^{-1}$, and the third axis of 1,400 min$^{-1}$, and grinding was performed by a crossfeed method. The grinding was performed until the thickness became 142 μm by the first axis, and then, the grinding was performed until the thickness became 102 μm by the second axis, and until the thickness became 100 μm by the third axis. A sample in which a crack or the like did not occur when the grinding was ended, was evaluated as "A", and a sample in which a crack or the like occurred, was evaluated as "C".

[Evaluation of Heat Resistance]

A state of the resin film for temporary fixing in the lamination sample was confirmed by using an ultrasonic microscope (Insight-300, manufactured by Insight Co., Ltd.). After that, the lamination sample was heated at 200° C. for 30 minutes, and then, at 260° C. for 10 minutes, and the state of the resin film for temporary fixing was confirmed again by using the ultrasonic microscope. A sample in which foam formation did not occur on the resin film for temporary fixing even in the heating treatment, was evaluated as "A", and a sample in which foam formation occurred, was evaluated as "C".

[Evaluation of Peeling Properties from Support Body]

A pair of tweezers having sharp tip ends were put between the support body and the resin film for temporary fixing in the lamination sample, and the pair of tweezers were moved along the outer edge. At this time, a sample in which the support body was capable of being peeled off without having any crack on the semiconductor wafer, was evaluated as "A", and a sample in which the support body was not capable of being peeled off, was evaluated as "C".

[Evaluation of Peeling Properties from Semiconductor Wafer]

In the lamination sample in which an evaluation value in the evaluation of peeling properties from the support body was "A", which an end portion of the film for temporary fixing, which was pasted onto the semiconductor wafer, was lifted by the pair of tweezers. At this time, a sample in which the resin layer for temporary fixing was capable of being peeled off from the semiconductor wafer, was evaluated as "A", a sample in which the resin layer for temporary fixing was capable of being peeled off from the semiconductor wafer, but residual dross occurred, was evaluated as "B", and a sample in which the resin layer for temporary fixing was not capable of being peeled off from the semiconductor wafer, was evaluated as "C". Furthermore, a case where the semiconductor wafer was not capable of being peeled off from the support body in [Evaluation of Peeling Properties from Support Body], was evaluated as "Unevaluable".

TABLE 2

| Item | | Example 1 | Example 2 | Example 3 | Example 4 | Example 5 | Comparative Example 1 | Comparative Example 2 |
|---|---|---|---|---|---|---|---|---|
| Resin Film for Temporary Fixing Material | | F-1 | F-2 | F-3 | F-4 | F-5 | F-6 | F-7 |
| Evaluation Result | Evaluation of Low Temperature Pasting Properties | A | A | A | A | A | A | A |
| | Evaluation of Back Grinding Properties | A | A | A | A | A | A | A |
| | Evaluation of Heat Resistance | A | A | A | A | A | C | A |
| | Evaluation of Peeling Properties from Support Body | A | A | A | A | A | C | A |
| | Evaluation of Peeling Properties from Semiconductor Wafer | A | A | A | A | A | Unevaluable | B |

In a manufacturing method using the resin films F-1 to F-5 for temporary fixing using the (meth)acrylic copolymers A-1 to A-5 having a not unevenly distributed reactive functional group (Examples 1 to 5), it is possible to efficiently manufacture an electronic component having sufficient low temperature pasting properties and flatness, in which excellent back grinding properties can be obtained even in a case where the resin film for temporary fixing was pasted onto the semiconductor wafer in a condition of lower than or equal to 160° C., and excellent heat resistance and peeling properties.

In contrast, in a manufacturing method using the resin film F-6 for temporary fixing using the (meth)acrylic copolymer C-1 not having a reactive functional group (Comparative Example 1), heat resistance and peeling properties of the resin film for temporary fixing were degraded, compared to the example described above, and in a manufacturing method using the resin film F-7 for temporary fixing using the (meth)acrylic copolymer C-2 having an unevenly distributed reactive functional group (Comparative Example 2), peeling properties of the resin film for temporary fixing were degraded, compared to the example described above, and thus, a manufacturing efficiency of an electronic component was degraded, compared to the example described above.

[Preparation of Two-Layer Resin Film for Temporary Fixing]

Example 6

The varnish V-1 was prepared as with Example 1, and the varnish V-1 was applied onto a release treatment surface of a polyethylene terephthalate film subjected to a release treatment (A31, manufactured by Teijin Dupont Films Limited, a thickness of 38 μm), and was heated and dried at 90° C. for 5 minutes, and at 140° C. for 5 minutes, and thus, a first thermoplastic resin layer was formed. After that, a polyethylene terephthalate film subjected to a release treatment (A31, manufactured by Teijin Dupont Films Limited, a thickness of 38 μm) was pasted onto the first thermoplastic resin layer as the protective film, and thus, a first resin sheet was obtained.

On the other hand, a varnish V-8 having a composition shown in Table 3 described below was prepared, the varnish V-8 was applied onto a release treatment surface of a polyethylene terephthalate film subjected to a release treatment (A31, manufactured by Teijin Dupont Films Limited, a thickness of 38 μm), was heated and dried at 90° C. for 5 minutes, and at 140° C. for 5 minutes, and thus, a second thermoplastic resin layer was formed. After that, a polyethylene terephthalate film subjected to a release treatment (A31, manufactured by Teijin Dupont Films Limited, a thickness of 38 μm) was pasted onto the second thermoplastic resin layer as the protective film, and thus, a second resin sheet was obtained.

(Composition of Varnish V-8)

TABLE 3

| Item | | Unit | V-8 |
|---|---|---|---|
| (Meth)Acrylic Copolymer | A-1 | Parts by Mass | 100 |
| (B) Epoxy Curing Agent | 2PZ-CN | Parts by Mass | 1 |
| (C) Silicone Compound | TA31-209E | Parts by Mass | 2.2 (solid content 1) |
| | SH550 | | 2 |
| | SH3773M | | 2 |
| Organic Solvent | Cyclohexanone | Parts by Mass | 300 |

The protective film was peeled off from each of the first resin sheet and the second resin sheet, and the first thermoplastic resin layer and the second thermoplastic resin layer were pasted at 60° C. by roll lamination, and thus, a two-layer resin film F-8 for temporary fixing was obtained.

Example 7

A two-layer resin film F-9 for temporary fixing was obtained as with Example 6, except that the varnish V-2 prepared as with Example 2, was used instead of the varnish V-1.

The resin films F-8 and F-9 for temporary fixing obtained as described above were subjected to various evaluations described above. Furthermore, the first resin sheet side was pasted onto the semiconductor wafer. Evaluation results are shown in Table 4.

TABLE 4

| | Item | Example 6 | Example 7 |
|---|---|---|---|
| | Resin Film for Temporary Fixing Material | F-8 | F-9 |
| Evaluation Result | Evaluation of Low Temperature Pasting Properties | A | A |
| | Evaluation of Back Grinding Properties | A | A |
| | Evaluation of Heat Resistance | A | A |
| | Evaluation of Peeling Properties from Support Body | A | A |
| | Evaluation of Peeling Properties from Semiconductor Wafer | A | A |

REFERENCE SIGNS LIST

1: resin film sheet for temporary fixing, 2, 3: resin film sheet for temporary fixing, 10: support film, 20, 26: resin film for temporary fixing, 22: first thermoplastic resin layer, 24: second thermoplastic resin layer, 30: protective film, 40: temporary fixing material, 50: support body, 52: peeling layer, 60: semiconductor wafer, 70: temporary fixing material, 80: semiconductor wafer, 82: through electrode, 84: dicing line, 86: through electrode, 90: grinder, 100: semiconductor element, 110: wiring substrate, 120: semiconductor device.

The invention claimed is:

1. A resin composition for temporary fixing for forming a film-like temporary fixing material which is used for manufacturing an electronic component,
   wherein a method for manufacturing the electronic component includes a step of temporarily fixing onto a support body a workpiece to become a member constituting an electronic component, via the film-like temporary fixing material, a step of processing the workpiece which is temporarily fixed onto the support body, and a step of separating the processed workpiece from the support body and the film-like temporary fixing material, and
   the film-like temporary fixing material contains an (meth)acrylic copolymer (A) having a not unevenly distributed an epoxy group, an epoxy curing agent (B), and a silicone compound (C),
   wherein the (meth)acrylic copolymer (A) having a not evenly distributed reactive functional group contains a (meth)acrylic monomer (a-1) in which a glass transition temperature of a homopolymer is higher than or equal to 50° C., a (meth)acrylic monomer (a-2) in which a glass transition temperature of a homopolymer is lower than or equal to 0° C., and a (meth)acrylic monomer (a-3) having an reactive functional group, as a copolymer component.

2. The resin composition for temporary fixing according to claim 1,
wherein the amount of the (meth)acrylic monomer (a-1) is 15 mass % to 50 mass %, the amount of the (meth)acrylic monomer (a-2) is 40 mass % to 70 mass %, and the (meth)acrylic monomer (a-3) is 10 mass % to 30 mass %, on the basis of the total amount of the copolymerization component.

3. The resin composition for temporary fixing according to claim 1,
wherein the (meth)acrylic monomer (a-2) in which the glass transition temperature of the homopolymer is lower than or equal to 0° C., is a (meth)acrylic monomer having an alkyl group of which the number of carbon atoms is 6 to 20.

4. The resin composition for temporary fixing according to claim 1,
wherein the epoxy curing agent (B) is an imidazole-based curing agent.

5. The resin composition for temporary fixing according to claim 1,
wherein the silicone compound (C) is a silicone modified alkyd resin.

6. A resin film for temporary fixing configured by forming the resin composition for temporary fixing according to claim 1 into the shape of a film.

7. A resin composition for temporary fixing for forming a film-like temporary fixing material which is used for manufacturing an electronic component,
wherein a method for manufacturing the electronic component includes a step of temporarily fixing onto a support body a workpiece to become a member constituting an electronic component, via the film-like temporary fixing material, a step of processing the workpiece which is temporarily fixed onto the support body, and a step of separating the processed workpiece from the support body and the film-like temporary fixing material, and the resin composition for temporary fixing contains,
(i) a (meth)acrylic copolymer (i) obtained by performing living radical polymerization with respect to a polymerizable composition containing a (meth)acrylic monomer (a-1) in which a glass transition temperature of an homopolymer is higher than or equal to 50° C., a (meth)acrylic monomer (a-2) in which a glass transition temperature of an homopolymer is lower than or equal to 0° C., and a (meth)acrylic monomer (a-3) having an reactive functional group, or
(ii) a (meth)acrylic copolymer (ii) obtained by performing polymerization while adding the (meth)acrylic monomer (a-3) having the reactive functional group into a polymerizable composition containing the (meth)acrylic monomer (a-1) in which the glass transition temperature of the homopolymer is higher than or equal to 50° C., and the (meth)acrylic monomer (a-2) in which the glass transition temperature of the homopolymer is lower than or equal to 0° C.

8. A resin film sheet for temporary fixing, comprising:
a support film; and
the resin film for temporary fixing according to claim 6, which is disposed on the support film.

9. A resin film sheet for temporary fixing, comprising:
a support film;
a first thermoplastic resin layer configured by forming the resin composition for temporary fixing according to claim 1, which is disposed on the support film, into the shape of a film; and
a second thermoplastic resin layer disposed on the first thermoplastic resin layer.

* * * * *